(12) United States Patent
Jang et al.

(10) Patent No.: US 11,873,995 B2
(45) Date of Patent: Jan. 16, 2024

(54) COOKING APPLIANCE AND METHOD FOR CONTROLLING THE SAME

(71) Applicant: LG ELECTRONICS INC., Seoul (KR)

(72) Inventors: Seungtae Jang, Seoul (KR); Chung Kang, Seoul (KR); Cheol Seung Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 263 days.

(21) Appl. No.: 17/359,412

(22) Filed: Jun. 25, 2021

(65) Prior Publication Data
US 2021/0404668 A1 Dec. 30, 2021

(30) Foreign Application Priority Data
Jun. 30, 2020 (KR) .................. 10-2020-0080292

(51) Int. Cl.
| F24C 15/00 | (2006.01) |
| F24C 3/12 | (2006.01) |
| F24C 7/08 | (2006.01) |
| H05K 7/14 | (2006.01) |
| H05K 7/20 | (2006.01) |

(52) U.S. Cl.
CPC ............ *F24C 15/006* (2013.01); *F24C 3/128* (2013.01); *F24C 7/085* (2013.01); *H05K 7/1427* (2013.01); *H05K 7/20172* (2013.01)

(58) Field of Classification Search
CPC ........ F24C 15/006; F24C 3/128; F24C 7/085; F24C 7/087; H05K 7/20172; H05K 7/20136; H05K 7/1427; H05K 7/20209; G01K 1/14; F24F 2110/10

USPC ......................................................... 454/184
See application file for complete search history.

(56) References Cited

U.S. PATENT DOCUMENTS

| 5,430,272 A * | 7/1995 | Takahashi .............. H05B 6/666 |
| | | 219/707 |
| 5,918,589 A | 7/1999 | Valle et al. |
| 6,104,003 A | 8/2000 | Jones |
| 6,188,189 B1 * | 2/2001 | Blake .................... F04D 27/004 |
| | | 318/471 |
| 7,079,387 B2 * | 7/2006 | Brooks ..................... G06F 1/20 |
| | | 165/185 |
| 2013/0031273 A1 | 11/2013 | Zehr |

(Continued)

FOREIGN PATENT DOCUMENTS

| DE | 10230242 A1 | 1/2004 | |
| EP | 2151631 A1 * | 2/2010 | ............ F24C 15/006 |
| EP | 2151631 A1 | 2/2010 | |

OTHER PUBLICATIONS

Dengler, EP2151631A1 Dengler Espacenet Machine Translation, European Patent Office, dated Feb. 10, 2010 (Year: 2010).*

*Primary Examiner* — Avinash A Savani
(74) *Attorney, Agent, or Firm* — Bryan Cave Leighton Paisner LLP

(57) ABSTRACT

The present disclosure relates to a cooking appliance and a method for controlling the same, wherein the cooking appliance determines whether a cooling fan stops operating based on results of monitoring of an increase per unit time in temperatures in a cool air passage, and when confirming the cooling fan stops operating, stops the heating unit from operating.

16 Claims, 11 Drawing Sheets

(56) References Cited

U.S. PATENT DOCUMENTS

| | | | |
|---|---|---|---|
| 2014/0230662 A1* | 8/2014 | Siegel | F24C 15/2021 |
| | | | 99/344 |
| 2015/0241069 A1* | 8/2015 | Brant | F24C 15/006 |
| | | | 126/21 A |
| 2020/0041136 A1* | 2/2020 | Christensen Phillips | ................ |
| | | | H05B 6/1263 |

* cited by examiner

COOKING APPLIANCE AND METHOD FOR CONTROLLING THE SAME

CROSS-REFERENCE TO RELATED APPLICATION

This application claims priority to and the benefit of Korean Patent Application No. 10-2020-0080292, filed on Jun. 30, 2020, the disclosure of which is incorporated herein by reference in its entirety.

TECHNICAL FIELD

Disclosed here is a cooking appliance, and specifically, a cooking appliance and a control method thereof provided with various electronic components in an electronic component space.

BACKGROUND

Cooking appliances are used to cook food, and are installed in the kitchen to cook food according to a user's intention. The cooking appliances can be classified in various ways, based on a heat source or a type, and the sort of fuel.

Additionally, the cooking appliances can be categorized into an open type cooking appliance in which food is placed in an open space, and a sealed type cooking appliance in which food is placed in a closed space, based on a way of cooking food. The sealed type cooking appliance includes an oven, a microwave oven and the like, and the open type cooking appliance includes a cooktop, a hob, a griddle and the like.

In the sealed type cooking appliance, a space, in which food is placed, is shielded, and the shielded space is heated to cook food. The sealed type cooking appliance is provided with a cooking space in which food is placed and which is shielded when the food is cooked. In the cooking space, food is actually cooked.

The sealed type cooking appliance is provided with a rotatable door that optionally opens and closes the cooking space. The rotatable door is installed at a main body by a door hinge provided between the main body, having the cooking space therein, and the door, and can rotate with respect to a body portion where the door and the main body are coupled through the door hinge to selectively open and close the cooking space.

A heat source is disposed in an inner space of the cooking space opened and closed by the door, to heat the cooking space. The heat source includes a gas burner or an electric heater and the like.

The cooking space includes an electronic component space in an upper portion thereof. In the electronic component space, electronic components required for operating the sealed type cooking appliance can be disposed. The electronic component space is formed as a space separate from the cooking space.

In the electronic component space, a cooling fan for cooling the electronic component space is disposed. The cooling fan can be provided in the form of a centrifugal fan such as a sirocco fan, and can be disposed eccentrically to a rear of the electronic component space. The cooling fan can suction external air to cool an inside of the electronic component space and can forcibly blow hot air in the electronic component space out of the sealed type cooking appliance to cool the electronic component space.

When the cooling fan is out of order, the electronic component space cannot be cooled properly. This causes an excessive increase in temperatures of electronic components in the electronic component space and a failure of the electronic components.

SUMMARY

Technical Problem

The present disclosure is directed to a cooking appliance and a method for controlling the same having an improved structure in which a failure of a cooling fan may be quickly found.

The present disclosure is also directed to a cooking appliance and a method for controlling the same having an improved structure in which a failure of an electronic component, caused by overheating, may be prevented.

The present disclosure is also directed to a method for controlling a cooking appliance, which may help to find a failure of the cooling fan quickly and may be applied to various types of ovens having different sizes of a cooking space and heat generating capacity.

The present disclosure is also directed to a method for controlling a cooking appliance, which may help to find a failure of the cooling fan quickly and may be effectively applied to a cooking appliance in which a plurality of units is stacked on top of one another.

To achieve the above aims, in a cooking appliance according to one aspect, a temperature measuring unit may be disposed at a supporter configured to support a circuit board, a cool air passage may be formed between a casing and the circuit board, and the temperature measuring unit may measure a temperature in the cool air passage.

Based on results of the temperature measuring unit's measurement of temperatures, a failure of a cooling fan may be found quickly.

The cooking appliance according to another aspect may control an operation of a heating unit using results of monitoring of an increase per unit time in temperature of the cool air passage formed between the casing and the circuit board. Here, an increase per unit time in temperature means an increase rate of temperatures measured by a temperature measuring unit.

Accordingly, a failure of the cooling fan may be found quickly and a cooking operation may stop immediately, thereby protecting electronic components from a failure caused by overheating.

Additionally, a method for controlling a cooking appliance according to another aspect, determination on whether the cooling fan stops operating may be made based on results of monitoring of an increase per unit time in temperature in the cool air passage, and when it is determined that the cooling fan stops operating, the heating unit may stop operating.

Accordingly, a control operation to stop the cooking appliance from operating at a time of failure of the cooling fan may be applied to various types of ovens having different sizes of cooking space and heat generating capacity.

With the above configuration, a failure of a cooling fan in all units of a cooking appliance in which a plurality of units is stacked on top of one another may be effectively found.

According to another aspect, when a difference between a current temperature value and a previous temperature value, measured predetermined time prior to measurement of the current temperature value, is equal to and greater than a predetermined difference, it may be determined that the cooling fan stops operating.

According to another aspect, when events, in which a difference between a current temperature value and a temperature value measured predetermined time prior to measurement of the current temperature value is equal to or greater than a predetermined difference, occur predetermined consecutive times, it may be determined that the cooling fan stops operating.

A cooking appliance according to one aspect, including a casing provided with a cooking space therein, a heating unit configured to heat the cooking space, and an electronic component space provided outside the casing, may include a circuit board disposed in the electronic component space; a supporter configured to space the circuit board from the casing and to support the circuit board; a cooling fan configured to generate a flow of cool air passing through a cool air passage that is surrounded by the casing, the circuit board and the supporter; a temperature measuring unit installed at the supporter and configured to measure temperatures in the cool air passage; and a controller configured to control an operation of the heating unit based on an increase per unit time in temperatures measured by the temperature measuring unit. Here, an increase per unit time in the temperatures means an increase rate of the temperatures.

The controller may stop the heating unit from operating when the increase per unit time in temperatures measured by the temperature measuring unit exceeds a predetermined value.

The temperature measuring unit may be disposed between the casing and the circuit board.

The electronic component space may be disposed upon the casing. The supporter may include an air guide disposed laterally adjacent to the circuit board, protruding from the casing upward, and blocking a lateral side of the cool air passage. The temperature measuring unit may be installed at the air guide.

The electronic component space may be disposed in the upper portion of the casing. A door may be disposed at a front of the casing to cover the cooking space. The cooling fan may be disposed rearward from the door. The temperature measuring unit may be disposed between the door and the cooling fan.

The temperature measuring unit may be disposed closer to the door than to the cooling fan.

A method for controlling the cooking appliance according to another aspect may include a monitoring step of monitoring an increase per unit time in temperatures in the cool air passage; a determining step of determining whether the cooling fan stops operating or not based on the monitored increase per unit time, i.e. based on results monitored in the monitoring step; and an operation controlling step of stopping the heating unit from operating when it is determined that the cooling fan stops operating.

The monitoring step may include a temperature measuring step of measuring temperatures in the cool air passage at a first predetermined time interval, and a comparing step of comparing a current value of one of the temperatures that are currently measured in the temperature measuring step with a previous value of one of the temperatures that were measured a second predetermined time before the current value is measured in the temperature measuring step. A time span of the second predetermined time may be greater than the first predetermined time interval.

The determining step may include determining that the cooling fan stops operating when a difference between the two measured values compared in the comparing step is equal to or greater than a predetermined difference.

The comparing step may be repeated at a third predetermined time interval which is less than the time span of the second predetermined time. The determining step may include determining that the cooling fan stopped operating when events, in which the difference between the two measured values compared in the comparing step is equal to or greater than the predetermined difference, occur predetermined consecutive times or greater.

The predetermined difference may be three to five ° C. The time span of the second predetermined time may be five to seven minutes. The third predetermined time interval may be 20 to 40 seconds. The predetermined consecutive times may be two to four times.

The comparing step may start after a time point when a temperature measured in the temperature measuring step equal to or greater than a predetermined comparison initiation temperature.

Additionally, the comparing step may start after the second predetermined time passes from the time point when a temperature measured in the temperature measuring step reaches the predetermined comparison initiation temperature or greater.

The cooking appliance may include a first unit disposed in an upper portion of the cooking appliance and a second unit disposed at a position lower than the first unit, the first unit and the second unit may respectively include the casing, the heating unit and the cooling fan, the temperature measuring unit may be disposed in the first unit, and the operation controlling step may include stopping the heating unit from operating when at least any one of the cooling fan of the first unit and the cooling fan of the second unit stops operating.

When the first unit operates, the comparing step may start from a time point when a temperature measured in the temperature measuring step reaches a first predetermined comparison initiation temperature or greater, and when the second unit operates, the comparing step may start from a time point when a temperature measured in the temperature measuring step reaches a second predetermined comparison initiation temperature or greater. The second predetermined comparison initiation temperature may be lower than the first predetermined comparison initiation temperature.

Using a cooking appliance and a method for controlling the same according to the present disclosure, a failure of a cooling fan may be quickly determined based on results of a temperature measuring unit's measurement of temperatures.

Additionally, when electronic components do not cool properly due to a failure of the cooling fan, the failure of the cooling fan may be quickly determined and a cooking operation may stop immediately, thereby protecting the electronic components from a failure caused by overeating.

Further, when the cooling fan fails, this control operation of stopping the operation of the cooking appliance at a time point of failure of the cooling fan may be applied to various types of ovens having different sizes of cooking space and heat generating capacity.

Furthermore, a failure of at least one cooling fan in a cooking appliance having a plurality of units stacked on top of one another may be effectively determined, and accordingly, electronic components may be protected from a failure caused by overheating.

BRIEF DESCRIPTION OF DRAWING

The accompanying drawings constitute a part of the specification, illustrate one or more embodiments in the disclosure, and together with the specification, explain the disclosure, wherein.

Figure 1:
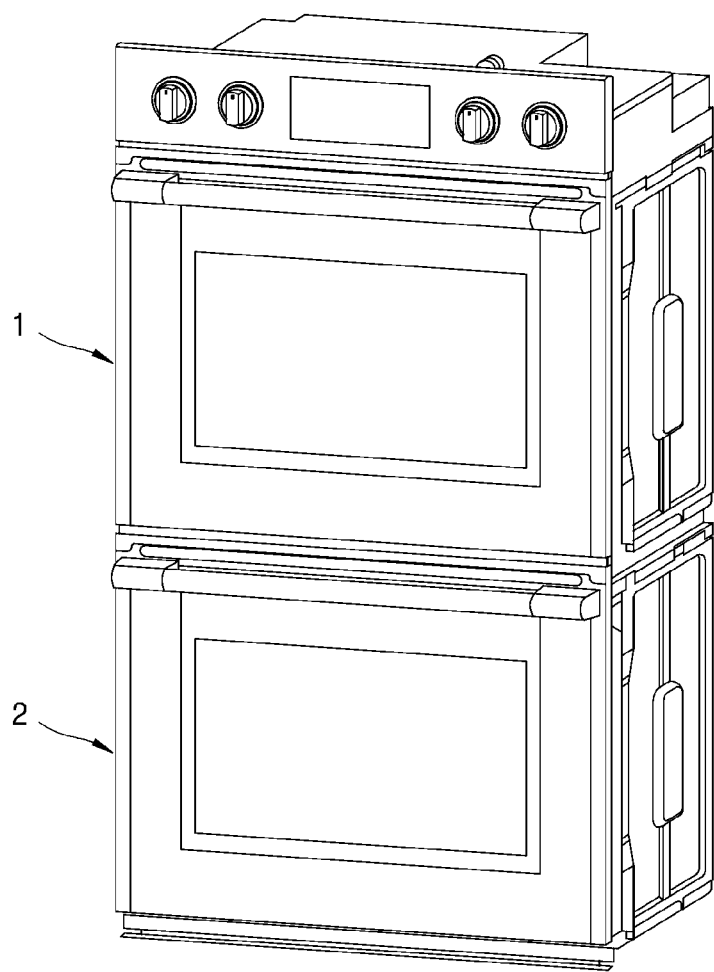
FIG. 1 is a front perspective view showing a cooking appliance according to the invention.

The above-described aspects, features and advantages are specifically described hereunder with reference to the accompanying drawings such that one having ordinary skill in the art to which the present disclosure pertains can easily implement the technical spirit of the disclosure. In the disclosure, detailed description of known technologies in relation to the disclosure is omitted if it is deemed to make the gist of the disclosure unnecessarily vague. Below, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component unless stated to the contrary.

When one component is described as being "in an upper portion (or a lower portion)" of another component, or "on (or under)" another component, one component can be placed on the upper surface (or under the lower surface) of another component, and an additional component may be interposed between another component and one component on (or under) another component.

When one component is described as being "connected", "coupled", or "connected" to another component, one component can be directly connected, coupled or connected to another component. However, it is also to be understood that an additional component can be "interposed" between the two components, or the two components can be "connected", "coupled", or "connected" through an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "have" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

[Entire Structure of Cooking Appliance]

Figure 2:
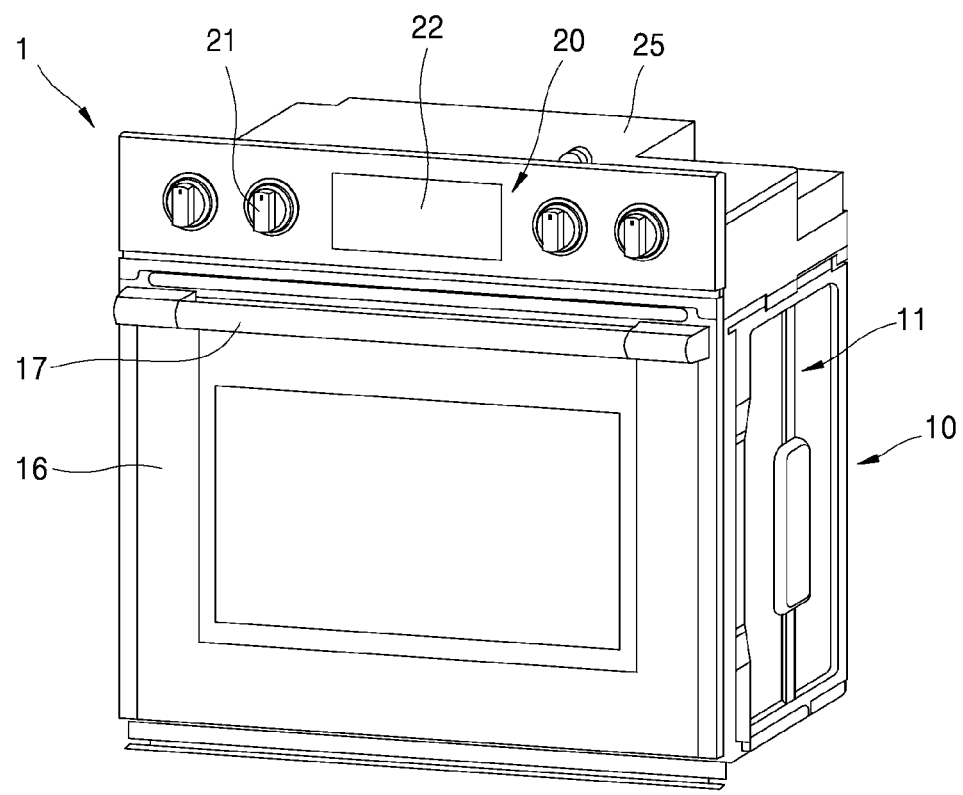
FIG. 2 is a front perspective view showing a portion separated from the cooking appliance in FIG. 1.
Figure 3:
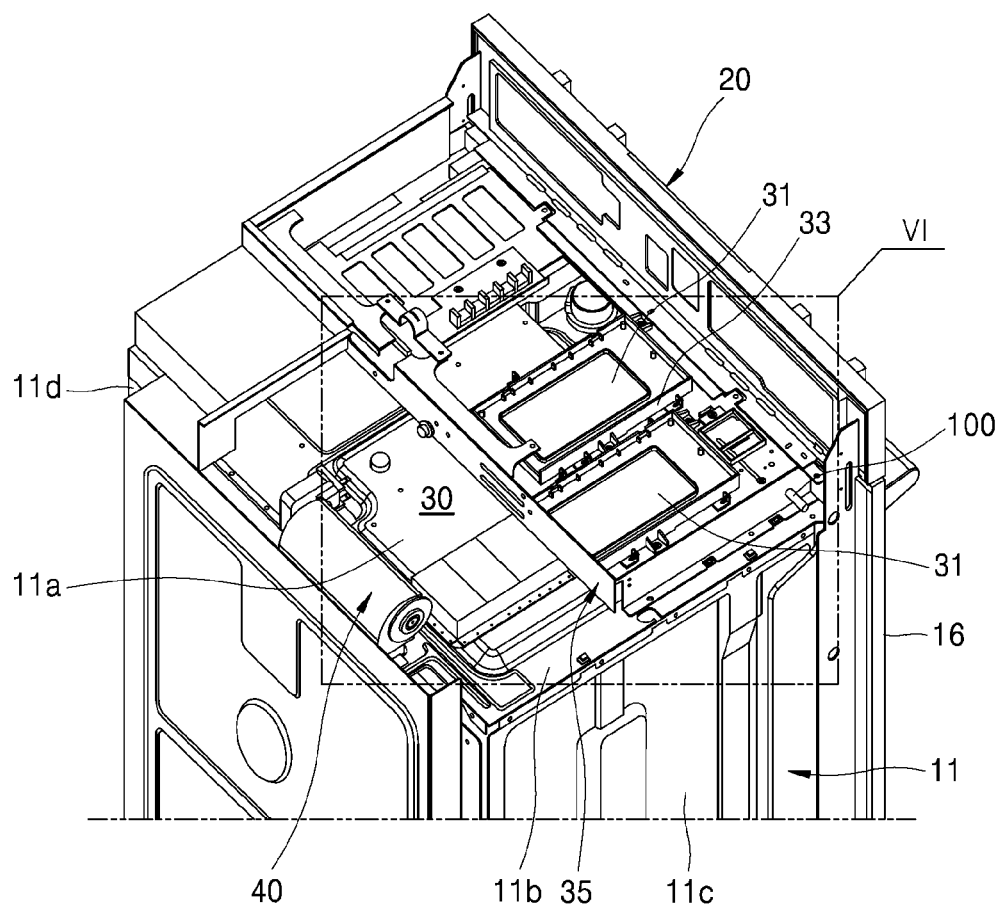
FIG. 3 is a rear perspective view showing the cooking appliance in FIG. 2.
Figure 4:
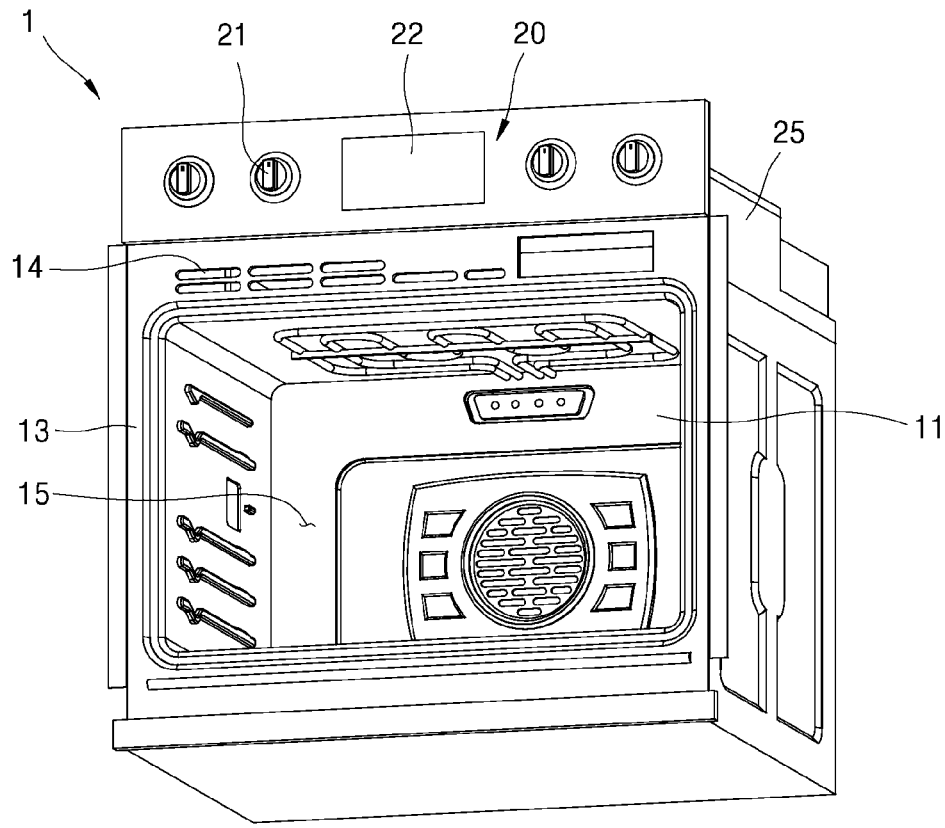
FIG. 4 is a front perspective view showing the cooing appliance in FIG. 3 without a door.

FIG. 1 is a front perspective view showing a cooking appliance according to the invention, and FIG. 2 is a front perspective view showing a portion separated from the cooking appliance in FIG. 1. FIG. 3 is a rear perspective view showing the cooking appliance in FIG. 2, and FIG. 4 is a front perspective view showing the cooking appliance in FIG. 3 without a door.

Referring to FIG. 1, the cooking appliance may include a first unit 1 in an upper portion of the cooking appliance, and a second unit 2 in a lower portion of the cooking appliance.

The first unit 1 and the second unit 2 may all be a sealed type cooking appliance such as an electric oven and the like, but not limited.

For example, the cooking appliance may include an electric oven as the first unit 1 in the upper portion thereof, and a gas oven as the second unit 2 in the lower portion thereof. On the contrary, the cooking appliance may include a gas oven as the first unit 1 in the upper portion thereof, and an electric oven as the second unit 2 in the lower portion thereof.

In another example, instead of an oven, another sort of sealed type cooking appliance such as a microwave oven may be used as the first unit 1 or the second unit 2, or an open type cooking appliance such as a cooktop, a hob, a griddle and the like may be used as the first unit 1 and disposed onto the second unit 2.

Hereunder, a configuration of a cooking appliance including electric ovens as the first unit 1 and the second unit 2 is described as an example. In the description, a configuration of the first unit 1 is mainly described.

Referring to FIGS. 2 to 4, a main body 10 may form an exterior of the first unit 1. The main body 10 may have a shape including an approximate cuboid shape, and may be made of a material having predetermined strength to protect various components installed in an inner space thereof.

The main body 10 may include a casing 11 forming a skeleton of the main body 10, and a front panel 13 disposed at a front of the casing 11 and forming a front surface of the main body 10. The casing 11 may have a cooking space 15 therein, and an opening configured to open the cooking space 15 forward may be formed inside the front panel 13.

The main body 10 may have the cooking space 15 therein. The cooking space 15 may have a hexahedron shape a front surface of which is open. With the cooking space 15 closed, an inner space of the cooking space 15 may be heated to cook food. That is, in the cooking appliance, the inner space of the cooking space 15 may be a space where food is actually cooked.

The cooking appliance may be provided with a heating unit configured to heat the cooking space 15. For example, a convection unit 18 may be provided as the heating unit on a rear side of the cooking space 15. The convection unit 18 may heat the inner space of the cooking space 15 as a result of convection of hot air. Additionally, an upper heater configured to heat the inner space of the cooking space 15 from an upper side of the cooking space 15 may be provided as the heating unit on the upper side of the cooking space 15, and a lower heater configured to heat the inner space of the cooking space 15 from a lower side of the cooking space 15 may be provided as the heating unit on the lower side of the cooking space 15.

The main body 10 may be provided with a door 16 configured to swivel and selectively open and close the cooking space 15, at a front thereof. The door 16 may be a pull-down type door that opens and closes the cooking space 15 in a way that an upper end of the door 16 swivels with respect to a lower end of the door 16 in an up-down direction.

The door 16 may have a hexahedron shape having a predetermined thickness as a whole, and may have a handle 17 on a front surface thereof. A user may grip the handle 17 to swivel the door 16.

A control panel 20 may be provided in an upper portion of a front surface of the cooking appliance, i.e., on a front surface of an upper portion of the casing 11. The control panel 20 may form a portion of an exterior of the front surface of the cooking appliance. The control panel 20 may include a knob 21 for controlling an operation of the cooking appliance, a display 22 configured to display an operation state of the cooking appliance, and the like.

An electronic component space 30 may be provided outside the casing 11. The electronic component space 30 may be disposed in the upper portion of the casing 11 and behind the control panel 20. In the electronic component space 30, a space for installing electronic components may be formed.

A front surface of the electronic component space 30 may be shielded by the front panel 13. The front panel 13 may be disposed between the casing 11 and the door 16. The front panel 13 may be disposed in a way that at least a portion of the front panel 13 blocks a front of the electronic component space 30. For example, an upper area of the front panel 13 disposed in an upper portion of the cooking space 15, may shield the front surface of the electronic component space 30.

The front panel 13 may have an inlet 14. The inlet 14 may be formed on the front panel 13 in a way that penetrates in a front-rear direction. The inlet 14 may form a passage for introducing air outside the electronic component space 30 into the electronic component space 30 on the front panel 13.

[Inner Structure of Electronic Component Space]

Upper, lateral and rear boundary surfaces of the electronic component space 30 may be defined by an electronic component space cover 25 covering the electronic component space 30 from above. Additionally, the lower boundary surface of the electronic component space 30 may be defined by an upper surface of the casing 11.

Figure 5:
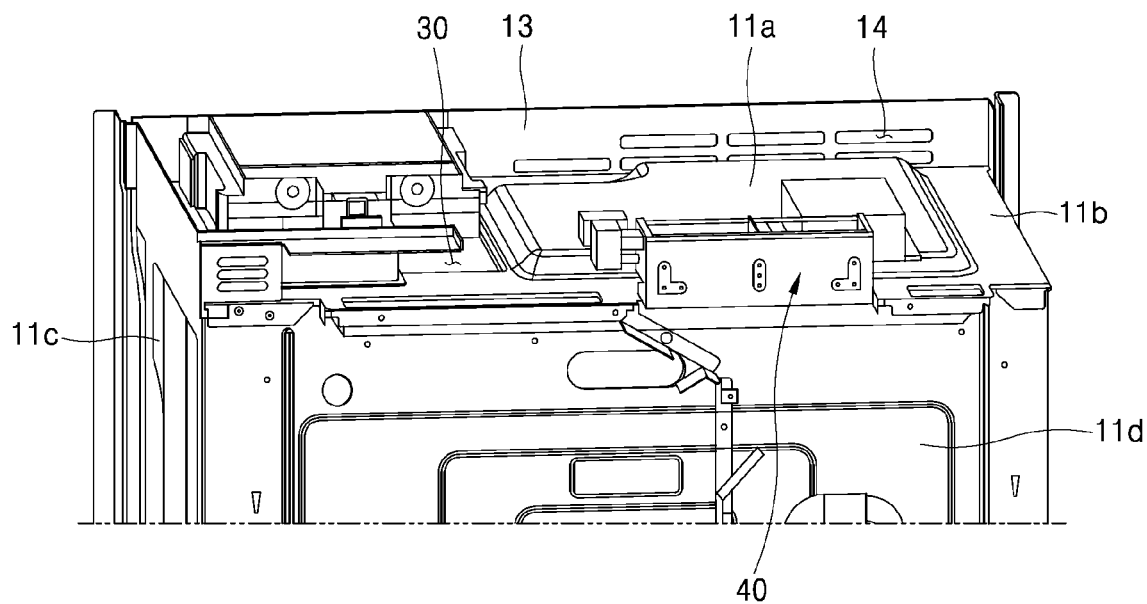
FIG. 5 is a rear perspective view showing the cooking appliance in FIG. 3 without some components.
Figure 6:
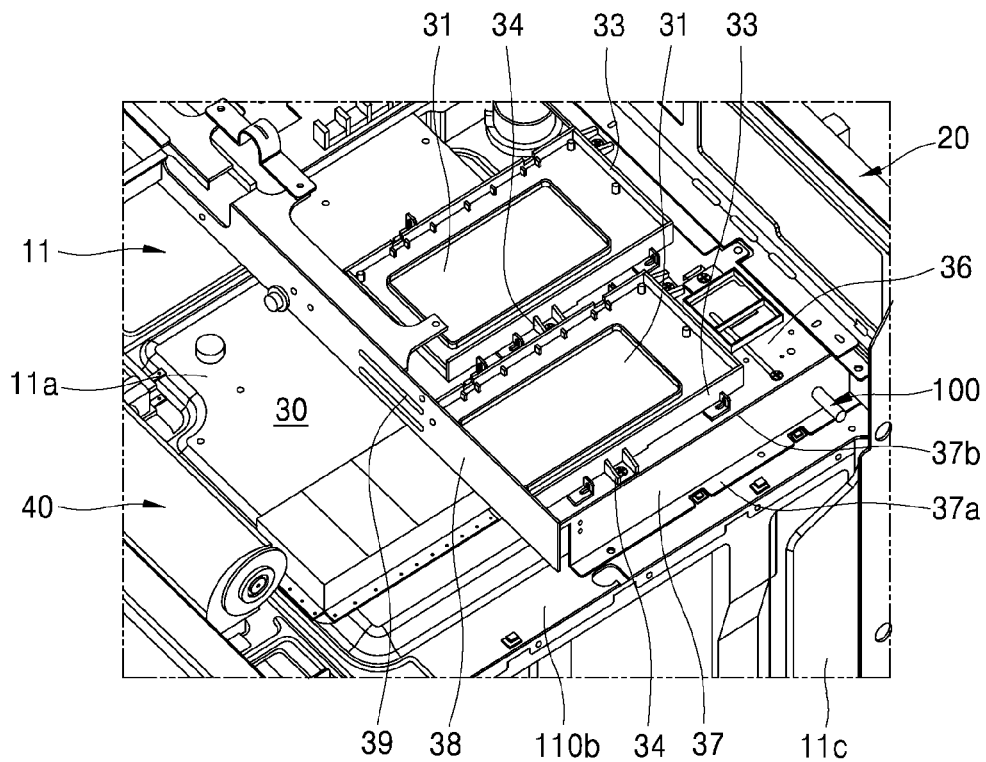
FIG. 6 is an enlarged rear perspective view showing a portion "VI" in FIG. 3.
Figure 7:
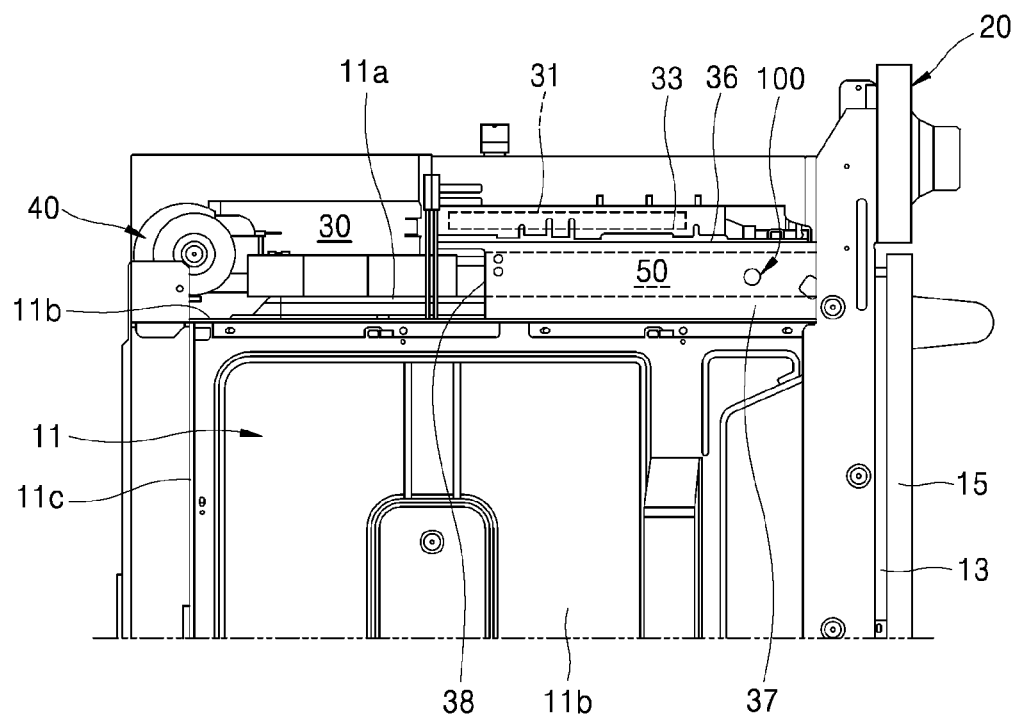
FIG. 7 is a side view showing the cooking appliance in FIG. 3.
Figure 8:
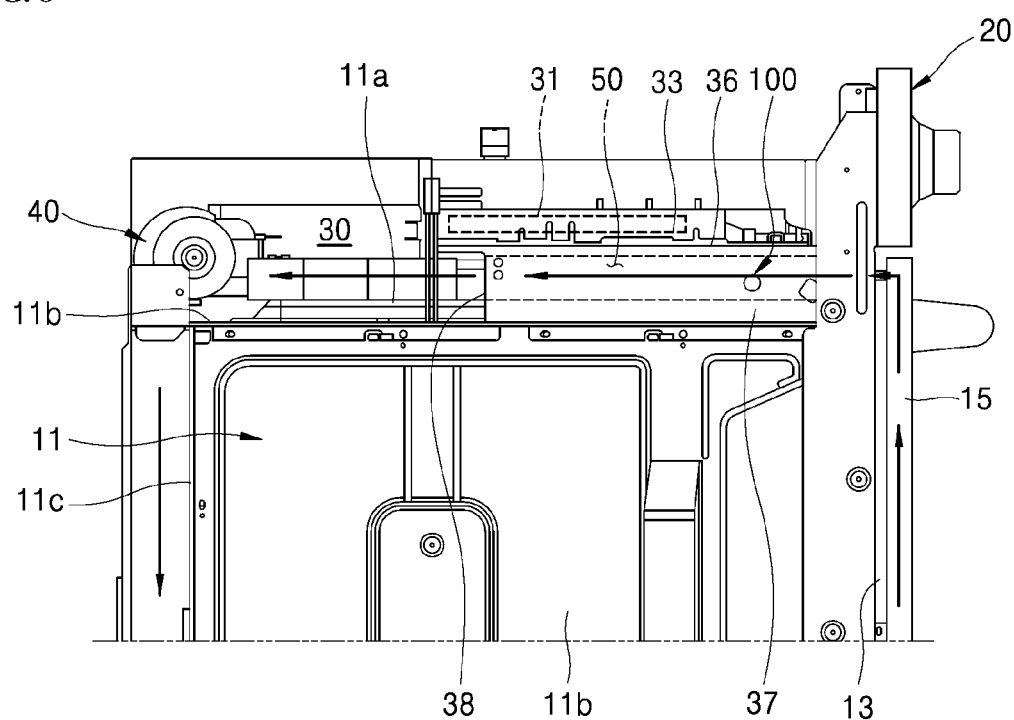
FIG. 8 is a view showing a flow of cool air in the cooking appliance in FIG. 7.

FIG. 5 is a rear perspective view showing the cooking appliance in FIG. 3 without some components, and FIG. 6 is an enlarged rear perspective view showing a portion of "VI" in FIG. 3. FIG. 7 is a side view showing the cooking appliance in FIG. 3, and FIG. 8 is a view showing a flow of cool air in the cooking appliance of FIG. 7.

In FIG. 5, the electronic component space cover, a circuit board, a supporter and the like are omitted. In FIGS. 6 and 7, the electronic component space cover is omitted.

The upper surface of the casing 11 may include a first area 11*a*, and a second area 11*b*, as illustrated in FIG. 5. The first area 11*a* may correspond to a portion disposed approximately at a center of the upper surface of the casing 11, and the second area 11*b* may correspond to a surrounding portion encircling the first area 11*a*. The first area 11*a* may be disposed further upward than the second area 11*b*, and a step may be formed between the first area 11*a* disposed upward and the second area 11*b* disposed downward.

As described above, various types of electronic components may be disposed in the electronic component space 30. For example, a circuit board 31 may be disposed in the electronic component space 30, as illustrated in FIG. 6. The circuit board 31 may be provided with various types of elements, a circuit and the like in relation to receipt of an operation signal, generation of a control signal for controlling an operation of the heating unit and the like input through the control panel 20.

The circuit board 31, as illustrated in FIGS. 6 and 7, may be disposed in the upper portion of the casing 11 through a supporter 35. The supporter 35 may support the circuit board 31 while spacing the circuit board 31 from the casing 11. For example, the supporter 35 may be disposed in the upper portion of the casing 11, and the circuit board 31 may be coupled to the supporter 35 at a position where the circuit board 31 is spaced upward from the casing 11. Accordingly, the circuit board 31 may be spaced a predetermined distance apart from the casing 11.

The supporter 35 may include a support plate 36, an air guide 37, and a rear plate 38.

The support plate 36 may form a flat surface in parallel with the upper surface of the casing 11. The support plate 36 may be spaced a predetermined distance from the upper surface of the casing 11. An upper surface of the supporter 35 may be defined by the support plate 36. That is, the support plate 36 may form the upper surface of the supporter 35.

The circuit board 31 may be mounted onto an upper surface of the support plate 36, for example. The circuit board 31 may be accommodated in a board case 33, and the board case 33 may be coupled to the support plate 36 in a state of being mounted onto the upper surface of the support plate 36.

The board case 33 may have a plurality of coupling projections 34. Each of the coupling projections 34 may be provided in a way that protrudes to an outside of the board case 33 in a lateral direction thereof. In a state where each coupling projection 34, provided as described above, and the support plate 36 contact each other in the up-down direction, the coupling projection 34 and the support plate 36 may be coupled using a screw. Accordingly, the board case 33 and the support plate 36 may be coupled.

That is, the board case 33 may be fixed onto the upper surface of the support plate 36, and the circuit board 31 may be accommodated in the board case 33. Thus, the circuit board 31 may be fixed onto the upper surface of the support plate 36.

The air guide 37 may be disposed in a lower portion of the support plate 36, i.e., between the upper surface of the casing 11 and the support plate 36. Additionally, the air guide 37 may be disposed in a lateral portion of the circuit board 31. The air guide 37 may be formed into a flat surface in parallel with a side 11*c* of the casing 11 and may form a side of the supporter 35.

The support plate 36 may have a length greater than a length of the circuit board 31 in the front-rear direction. The air guide 37 may have a length corresponding to the front-rear length of the support plate 36.

The air guide 37 may be coupled to the upper surface of the casing 11, and the support plate 36. To this end, the air guide 37 may have a lower end coupling surface 37a and an upper end coupling surface 37b, respectively at a lower end and an upper end thereof.

The lower end coupling surface 37a may be disposed at the lower end of the air guide 37 and formed into a flat surface in parallel with the upper surface of the casing 11. The upper end coupling surface 37b may be disposed at the upper end of the air guide 37 and formed into a flat surface in parallel with the support plate 36. For example, the lower end coupling surface 37a and the upper end coupling surface 37b may be formed in a way that a portion of an upper side of the air guide 37 and a portion of a lower side of the air guide 37 are bent.

The lower end coupling surface 37a may be coupled to the upper surface of the casing 11 in contact with the upper surface of the casing 11. The upper end coupling surface 37b may be coupled to the support plate 36 in contact with a lower surface or the upper surface of the support plate 36. The lower end coupling surface 37a and the casing 11, and the upper end coupling surface 37b and the support plate 36 may be screw-coupled.

For example, the casing 11, the air guide 37, and the support plate 36 may also be coupled, in a way that the coupling projection 34, the support plate 36 and the upper end coupling surface 37b are coupled by a single screw at a time, in a state where the coupling projection 34, the support plate 36 and the upper end coupling surface 37b overlap in the up-down direction.

As a result of coupling among the casing 11, the air guide 37 and the support plate 36, the support plate 36 may be spaced from the upper surface of the casing 11 by an approximate height of the air guide 37. Accordingly, the circuit board 31 supported by the support plate 36 may also be spaced from the upper surface of the casing 11 by an approximate height of the air guide 37.

Additionally, the support plate 36 may be coupled to the front panel 13 disposed at a front thereof. For example, a portion of an upper end of the front panel 13 may be bent to form a coupling surface in parallel with the support plate 36, and a portion of the support plate 36 may protrude toward the front panel 13 to be coupled to the coupling surface of the front panel 13.

Like the air guide 37, the rear plate 38 may be disposed in the lower portion of the support plate 36, i.e., between the upper surface of the casing 11 and the support plate 36. Additionally, the air guide 37 may be disposed at a rear of the circuit board 31. The rear plate 38 may be formed into a flat surface in parallel with a rear surface 11d of the casing 11 and may form a rear surface of the supporter 35.

The rear plate 38 may be disposed between a cooling fan 40 described below and the circuit board 31. The rear plate 38 may form a blocking wall that blocks between the cooling fan 40 and the circuit board 31.

Unlike the air guide 37 mounted onto the first area 11a of the upper surface of the casing 11, the rear plate 38 may be mounted onto the second area 11b of the upper surface of the casing 11. That is, the rear plate 38 may be disposed further upward than the air guide 37 and may protrude further upward than the air guide 37 and the circuit board 31. The rear plate 38 may be coupled to at least any one of the air guide 37 and the support plate 36 and fixed to the rear of the circuit board 31.

A cool air passage 50 may be formed between the upper surface of the casing 11, and the support plate 36 spaced apart from each other. The cool air passage 50 may form a space encircled (i.e. surrounded) by the upper surface of the casing 11, the support plate 36 and the air guide 37. A front of the cool air passage 50 may be blocked by the front panel 13, and a rear of the cool air passage 50 may be blocked by the rear plate 38.

That is, an upper surface of the cool air passage 50 may be defined by the support plate 36, and a side of the cool air passage 50 may be defined by the air guide 37, and a front surface and a rear surface of the cool air passage 50 may be respectively defined by the front panel 13 and the rear plate 38.

The cool air passage 50, as illustrated in FIGS. 3 and 5, may connect to the inlet 14 formed on the front panel 13. That is, the inlet 14 may form a passage for introducing air outside the cooking appliance into the cool air passage 50 on the front panel 13, as illustrated in FIGS. 5 to 7.

Further, an outlet 39 may be formed on the rear plate 38 in a way that penetrates in the front-rear direction. The cool air passage may connect to the outlet 39, and the outlet 39 may form a passage for allowing air in the cool air passage 50 to pass through the rear plate 38 on the rear plate 38.

The cooling fan 40 may be disposed near the rear surface of the casing 11 while disposed in the electronic component space 30. The cooling fan 40 may include a turbo fan disposed on the upper surface of the casing 11. The cooling fan 40 may suction air at a front of the electronic component space 30 and discharge the air to a space at the rear of the cooking space 15.

Additionally, a lower through hole, communicating with the space at the rear of the cooking space 15 and being open forward, may be provided in a lower portion of the front of the main body 10.

When the cooling fan 40 operates, external air in the lower portion of the front of the main body 10 may be introduced into the door 16 through an air flow hole provided in a lower portion of the door 16 and then may rise, as illustrated in FIG. 8. In this process, the door 16, heated by air delivered from the cooking space 15 to the door 16, may cool.

The air rising in the door 16 may be introduced into the electronic component space 30 through an air flow hole provided in an upper portion of the door 16 and through the inlet 14 formed on the front panel 13 in a penetrating manner. The air introduced into the electronic component space 30 may be suctioned to the cooling fan 40, may cool electronic components in the electronic component space 30, may be discharged to the space at the rear of the cooking space 15, and then may be discharged to the front of the main body 10.

The air introduced into the electronic component space 30 through the inlet 14, i.e., most of the cool air, may pass through the cool air passage 50. The flow of the cool air may be guided by the air guide 37 disposed on the side of the cool air passage 50.

The cool air introduced into the cool air passage 50 may cool the electronic components such as the circuit board 31 supported by the supporter 35, may escape from the cool air passage 50 through the outlet 39 and may be suctioned into the cooling fan 40.

Referring to FIGS. 6 and 7, a space between the cool air passage 50 and the cooling fan 40 may be blocked by the rear plate 38, and a passage between the cool air passage 50 and the cooling fan 40 may be formed only by the outlet 39. Accordingly, cool air introduced into the cool air passage 50 may cool the circuit board 31 and the like while staying in the cool air passage 50 for a short period of time instead of immediately escaping from the cool air passage 50, and then may be discharged out of the cool air passage 50 through the outlet 39.

Thus, a temperature of the air introduced into the cool air passage 50 may be similar to a temperature of the air heat-exchanged with the circuit board 31 and the like, e.g., a temperature of the circuit board 31, rather than a temperature of the cool air before the introduction of the cool air into the inlet 14.

The cooking appliance may further include a temperature measuring unit 100. The temperature measuring unit 100 may be provided to measure temperatures of the electronic components disposed in the electronic component space 30. The temperature measuring unit 100 may be provided to measure a temperature of the circuit board 31, for example.

[Disposition Structure of Temperature Measuring Unit]

The temperature measuring unit 100 may be installed at the supporter 35 and supported by the supporter 35. The temperature measuring unit 100 may measure a temperature in the cool air passage 50 to indirectly measure the temperature of the circuit board 31. The temperature measuring unit 100 may measure the temperature of the circuit board 31 as described above, and measurements of the temperature measuring unit 100 may be used as data for determining whether the cooling fan 40 operates.

The temperature measuring unit 100 may include a thermistor installed at the supporter 35 and configured to measure a temperature in the cool air passage 50, for example.

The temperature measuring unit 100 may be disposed between the upper surface of the casing 11, and the circuit board 31. An up-down position of the temperature measuring unit 100 may be between the upper surface of the casing 11, and the circuit board 31. Additionally, a front-rear position of the temperature measuring unit 100 may overlap a position of the circuit board 31.

Specifically, the temperature measuring unit 100 may be installed at the air guide 37. The air guide 37 may be a component between the upper surface of the casing 11, and the circuit board 31. Further, the air guide 37 may be a component disposed in lateral portions of the circuit board 31 and the cool air passage 50.

Since the temperature measuring unit 100 is installed at the air guide 37, the temperature measuring unit 100 may be disposed between the upper surface of the casing 11, and the circuit board 31. Additionally, since at least a portion of the temperature measuring unit 100 protrudes toward the cool air passage 50, the temperature measuring unit 100 may be disposed at a position that overlaps the position of the circuit board 31, and at least a portion of the temperature measuring unit 100 may be disposed in the cool air passage 50.

The disposition of the temperature measuring unit 100 between the upper surface of the casing 11 and the circuit board 31, and the disposition of the temperature measuring unit 100 in the cool air passage 50 may produce the following effects.

During cooking in the coking space 15, a temperature in the cooking space 15 may rise due to heat generated by the heating unit. Additionally, a temperature of the casing 11 encircling an outside of the cooking space 15 may also rise. That is, during cooking in the cooking space 15, the temperature of the casing 11 may remain high.

Accordingly, when the temperature measuring unit 100 is disposed in contact with the casing 11 or disposed at a position very close to the casing 11, the temperature of the casing 11 may significantly affect results of the temperature measuring unit 100's measurement of temperatures. That is, a temperature measured by the temperature measuring unit 100 may be almost similar to the temperature of the casing 11.

Thus, since the results of the temperature measuring unit 100's measurement are greatly affected by the temperature of the casing 11 regardless of whether cool air is passing through the cool air passage 50, it is difficult to determine whether the cooling fan 40 operates, based on the results of the temperature measuring unit 100's measurement.

When the cooking appliance described above operates, the circuit board 31 may generate heat during its operation. Accordingly, a temperature of the circuit board 31 may rise. Additionally, since heat generated through the casing 11 affects the temperature of the circuit board 31, the temperature of the circuit board 31 may rise while the cooking appliance operates.

Accordingly, when the temperature measuring unit 100 is disposed in contact with the circuit board 31 or disposed at a position very close to the circuit board 31, the temperature of the circuit board 31 may significantly affect the results of the temperature measuring unit 100's measurement of temperatures. That is, a temperature measured by the temperature measuring unit 100 may be almost similar to the temperature of the circuit board 31.

Thus, since the results of the temperature measuring unit 100's measurement are greatly affected by the temperature of the circuit board 31 regardless of whether cool air is passing through the cool air passage 50, it is difficult to determine whether the cooling fan 40 operates, based on the results of the temperature measuring unit 100's measurement.

Considering this, the temperature measuring unit 100 may be disposed between the upper surface of the casing 11, and the circuit board 31, and may be somewhat spaced apart from the casing 11 and the circuit board 31.

In an example, the temperature measuring unit 100 may be spaced the same distance respectively apart from the upper surface of the casing 11 and the circuit board 31. In another example, considering the temperature of the casing 11 higher than that of the circuit board 31, the temperature measuring unit 100 may be disposed at a position a little closer to the circuit board 31 than to the upper surface of the casing 11. In this case, certainly, the temperature measuring unit 100 may not be disposed in contact with the circuit board 31 or may not be disposed at a position too close to the circuit board 31.

The front-rear position of the temperature measuring unit 100 may be between the door 16 and the cooling fan 40, and may be disposed closer to the door 16 than to the cooling fan 40.

The cooling fan 40 may be disposed in the electronic component space 30, and disposed eccentrically to a rear of the electronic component space 30. That is, the cooling fan 40 may be disposed near the rear surface of the casing 11.

The circuit board 31 may be disposed eccentrically to the front of the electronic component space 30. That is, the circuit board 31 may be disposed near the control panel 20. Since the control panel 20 is disposed at the front of the electronic component space 30, the circuit board 31 needs to be disposed eccentrically to the front of the electronic component space 30 to simplify a wire connection between the control panel 20 and the circuit board 31 and make the wire connection more efficient.

When the circuit board 31 is disposed eccentrically to the front of the electronic component space 30 as described above, i.e., when the circuit board 31 is disposed closer to the door 16 than to the cooling fan 4, the temperature measuring unit 100 needs to be disposed closer to the door 16 than to the cooling fan 40. When the temperature measuring unit 100 is disposed closer to the door 16 than to the cooling fan 40, the temperature measuring unit 100 may effectively measure the temperature in the cool air passage 50 and may be designed to be fixed to the supporter 35.

As the temperature measuring unit 100 becomes closer to the cooling fan 40, the temperature measuring unit 100 may be more affected by the cooling fan 40 than by the circuit board 31. That is, the results of the temperature measuring unit 100's measurement may be more affected by whether the cooling fan 40 operates than by a temperature of the circuit board 31.

Additionally, when the temperature measuring unit 100 is disposed near the cooling fan 40, it is difficult to install the temperature measuring unit 100 at the supporter 35. For the temperature measuring unit 100 to be disposed near the cooling fan 40, the front-rear length of the supporter 35 may excessively increase or an additional structure for fixing the temperature measuring unit 100 needs to be added.

Considering this, the temperature measuring unit 100 may be installed at the supporter 35, specifically, the air guide 37, and may be disposed closer to the door 16 than to the cooling fan 40 such that at least a portion of the temperature measuring unit 100 is disposed in the cool air passage 50.

However, it is undesirable to dispose the temperature measuring unit 100 too close to the door 16. While the door 16 is opened and closed, hot air in the cooking space 15 may be introduced into the electronic component space 30 through the inlet 14 (see FIG. 15), and the hot air introduced may be a cause for distortion of the results of the temperature measuring unit 100's measurement.

Accordingly, while the temperature measuring unit 100 is disposed between the inlet 14 and the cooling fan 40, the temperature measuring unit 100 may be spaced from the inlet 14 rearward by a predetermined distance.

The predetermined distance may be determined considering a scope affected by the hot air in the cooking space 15, which is introduced into the electronic component space through the inlet 14 during the opening and closing of the door 16.

For example, suppose that in the electronic component space 30, an area in a range of 10 mm from the inlet 14 in a rearward direction thereof undergoes a rapid increase in its temperature when the door 16 is opened and then closed. Then the predetermined distance may be set to 10 mm.

The predetermined distance may be a distance (hereinafter, "circuit board spaced distance") or greater between the circuit board 31 and the upper surface of the casing 11 that are spaced from each other. For example, if the circuit board spaced distance is 10 mm, the predetermined distance may be set to 10 mm or greater.

This means that the temperature measuring unit 100 needs to be spaced from the inlet 14 and that the temperature measuring unit 10 needs to be spaced from the inlet 14 by at least the circuit board spaced distance.

Ordinarily, the circuit board 31 may be spaced from the casing 11 to such an extent that heat of the casing 11 does not directly affect the circuit board 31. Considering this, it may be assumed that an area spaced from the inlet 14 rearward by the circuit board spaced distance or greater is not directly affected by hot air that is introduced when the door 16 is opened and then closed.

Accordingly, the temperature measuring unit 100 may be spaced from the inlet 14 by the circuit board spaced distance or greater. Thus, the results of the temperature measuring unit 100's measurement may not be affected by the hot air that is introduced when the door 16 is opened and then closed.

In another example, a scope affected by hot air in the cooking space 15, which is introduced into the electronic component space through the inlet 14 during the opening and closing of the door 16, may be actually measured, and based on results of the measurement, the predetermined distance may also be determined.

[Configuration Regarding Function of Detecting Failure of Cooling Fan]

Figure 9:
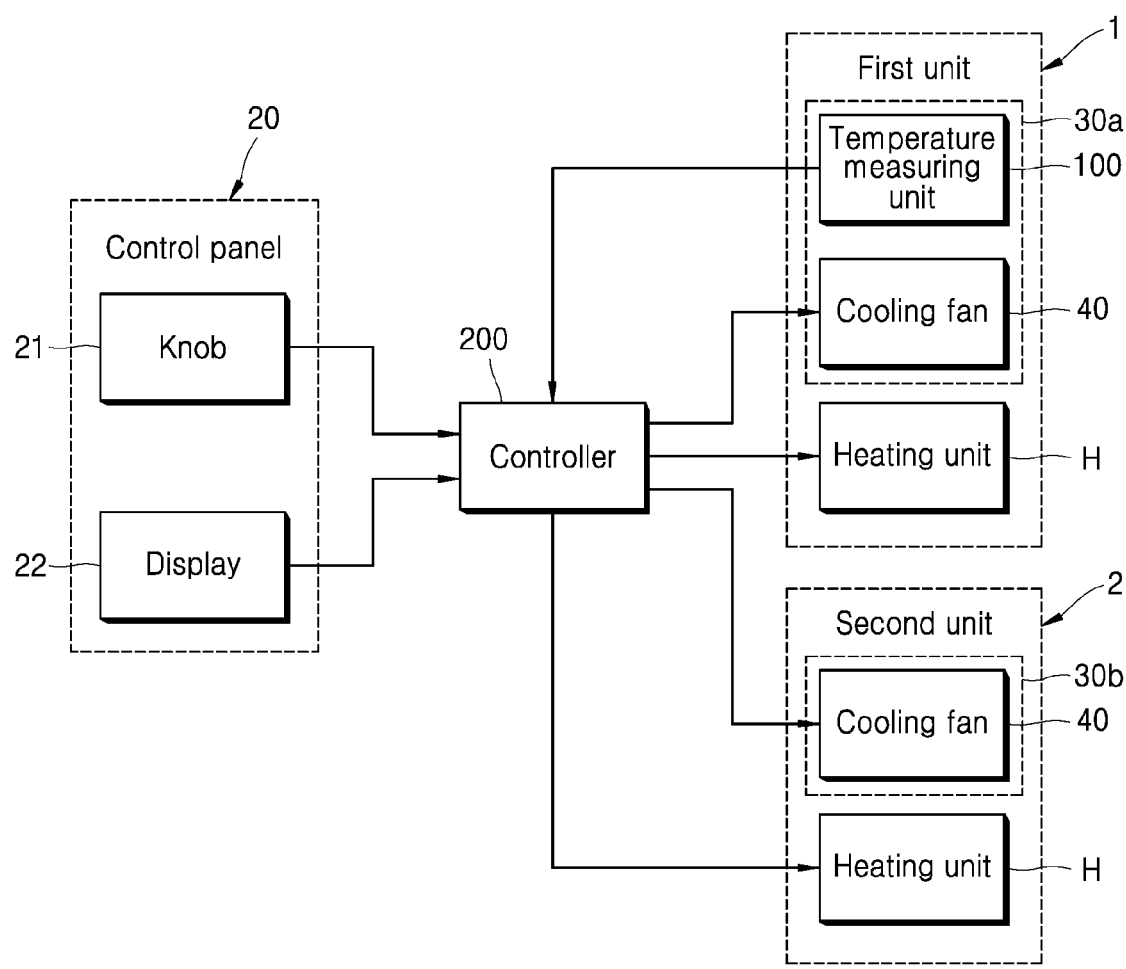
FIG. 9 is a block diagram schematically showing a configuration of the cooking appliance.

FIG. 9 is a block diagram schematically showing a configuration of the cooking appliance.

The cooking appliance may include a controller 200, as illustrated in FIGS. 6 to 9. The controller 200 may control a cooking operation of the cooking appliance. For example, the controller 200 may control operations of the heating unit and the cooling fan 40 based on an operation signal input through the knob 21 and the like of the control panel 20.

The controller 200 may also control an operation of the display 22 configured to display an operation state of the cooking appliance. In an example, the controller 200 may include a micro controller mounted onto the circuit board 31.

Additionally, the controller 200 may stop a cooking operation of the cooking appliance when an increase per unit time in temperatures measured by the temperature measuring unit 100 exceeds a predetermined range. Description in relation to this is provided hereunder.

Ordinarily, while the cooking appliance performs a cooking operation, the heating unit H operates, and then temperatures of the casing 11 and the circuit board 31 may gradually increase. The temperature of the circuit board 31 may increase due to heat generated as a result of operation of the circuit board 31 or due to the effect of heat of the casing 11 on the circuit board 31.

While the heating unit H operates as described above, the cooling fan 40 may also operate. When the cooling fan 40 operates, external air in the lower portion of the front of the main body 10 may be introduced through a lower portion of the door 16 and then may be discharged through an upper portion of the door 16 while cooling the door 16, and the air discharged through the upper portion of the door 16 may be introduced into the cool air passage 50 through the inlet 14 that is formed on the front panel 13 in a penetrating manner.

The cool air introduced into the cool air passage 50 may cool the electronic components such as the circuit board 31 supported by the supporter 35 and the like, may escape from the cool air passage 50 through the outlet 39, may be suctioned into the cooling fan 40, may be discharged to the space at the rear of the cooking space 15 and then may be discharged to the front of the main body 10.

The space between the cool air passage 50 and the cooling fan 40 may be blocked by the rear plate 38, and a passage between the cool air passage 50 and the cooling fan 40 may be formed only by the outlet 39. Accordingly, the cool air introduced into the cool air passage 50 may cool the circuit board 31 and the like while staying in the cool air passage 50 for a short period of time instead of immediately escaping from the cool air passage 50, and then may be discharged out of the cool air passage 50 through the outlet 39.

The cooling fan 40 and the heating unit H may be disposed in both the first unit 1 and the second unit 2. The temperature measuring unit 100 may be disposed in at least any one of the first unit 1 and the second unit 2. The temperature measuring unit 100 is disposed in the first unit 1, for example.

[Logic of Detection of Failure of Cooling Fan]

Figure 10:
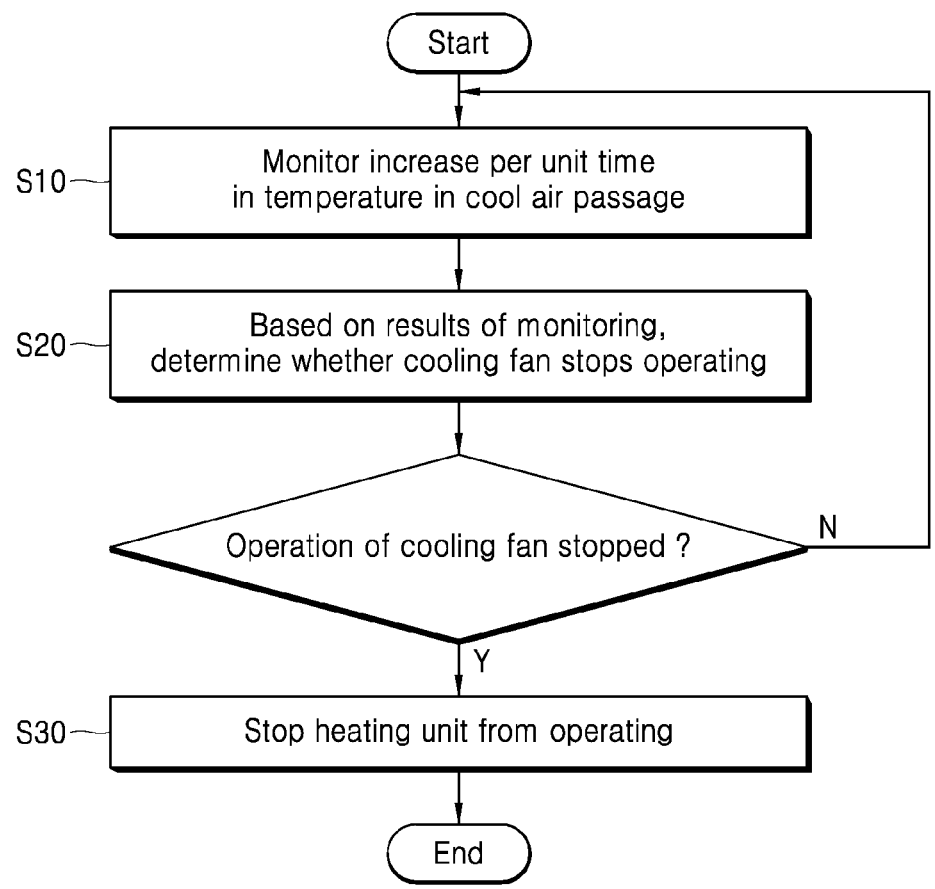
FIG. 10 is a flow chart schematically showing a process of controlling the cooking appliance.
Figure 11:
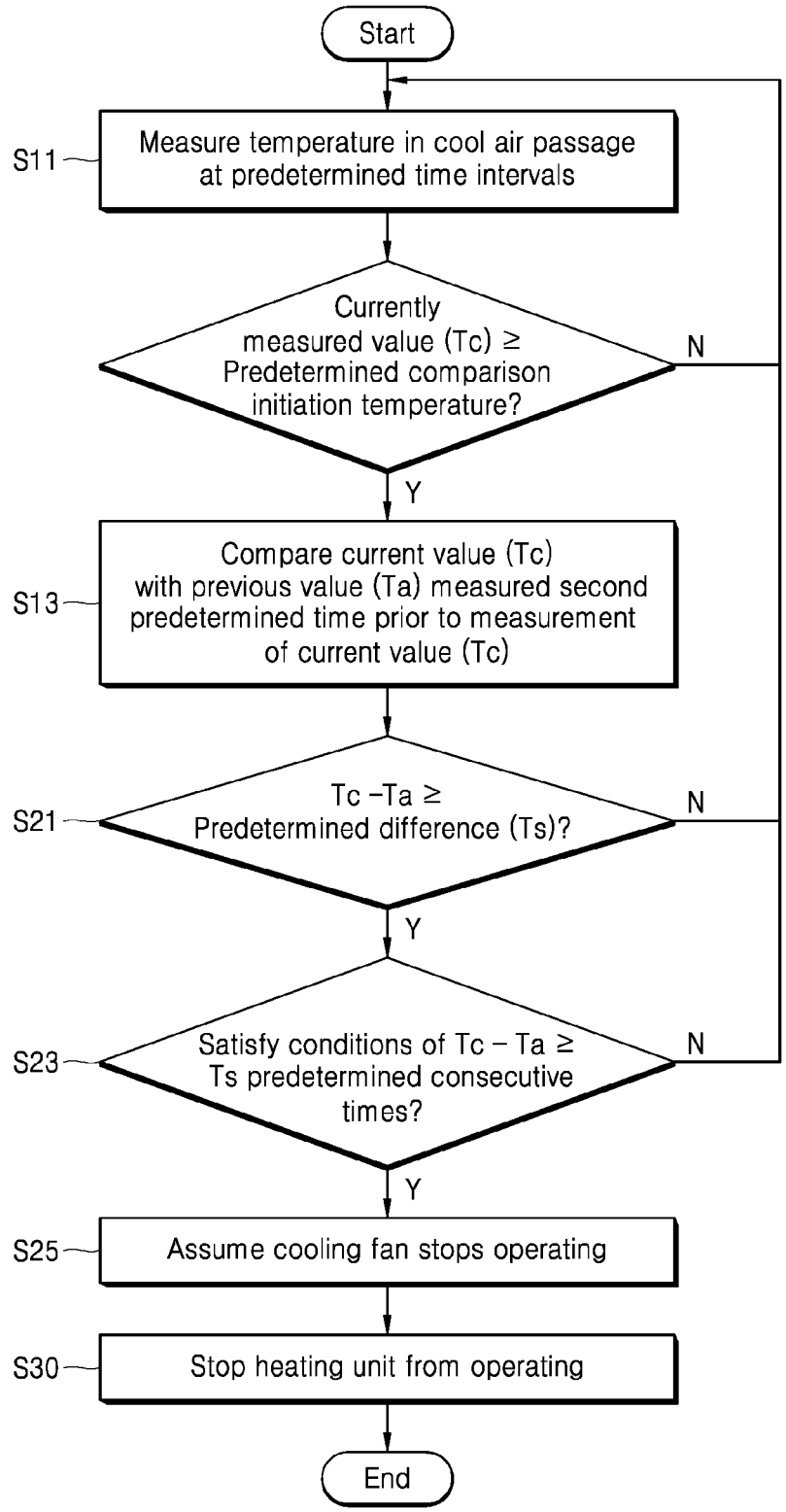
FIG. 11 is a flow chart showing processes of detecting a failure of a cooling fan and controlling an operation of a heating unit in the cooking appliance.
Figure 12:
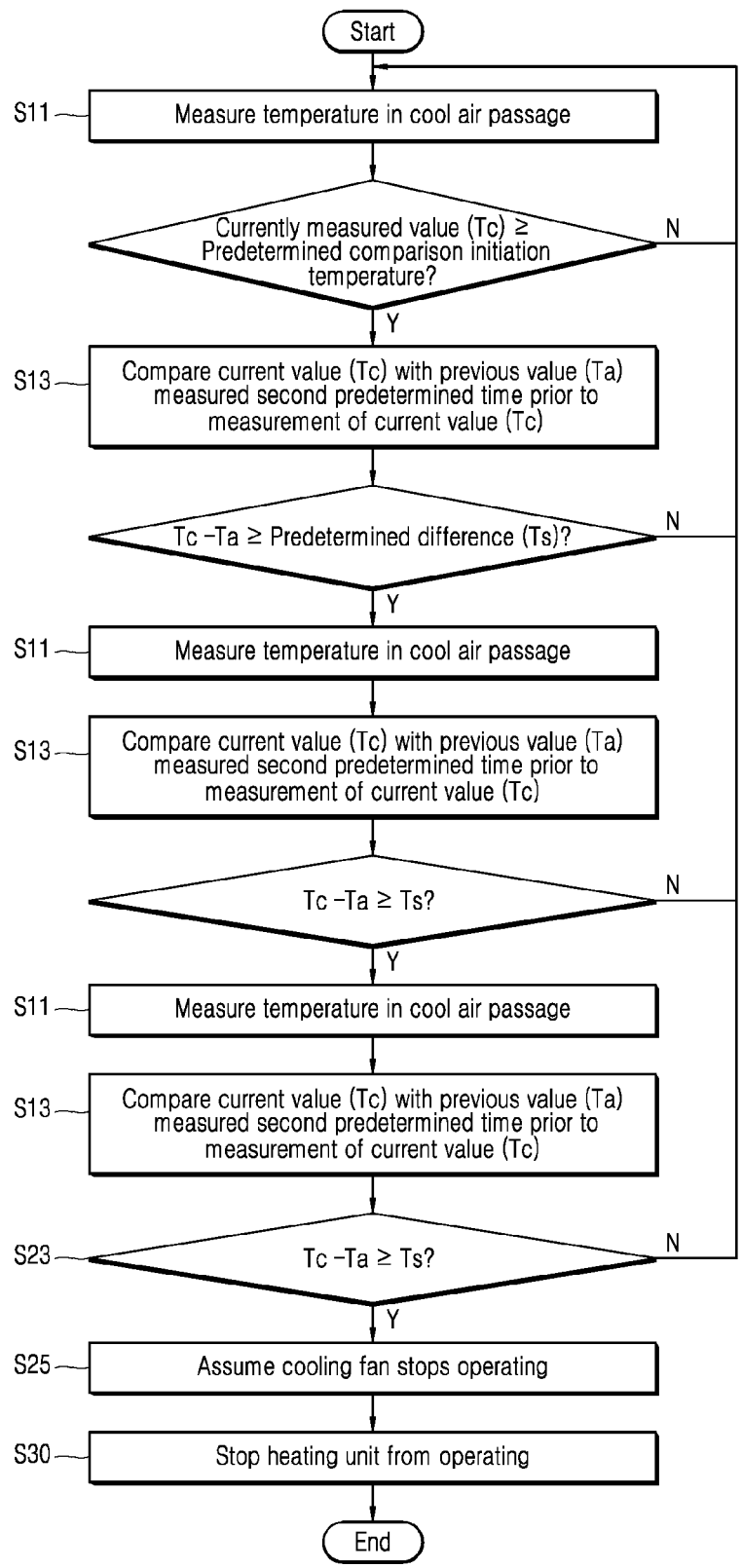
FIG. 12 is a flow chart specifically showing a process of detecting a failure of a cooling fan of the cooking appliance in one embodiment.
Figure 13:
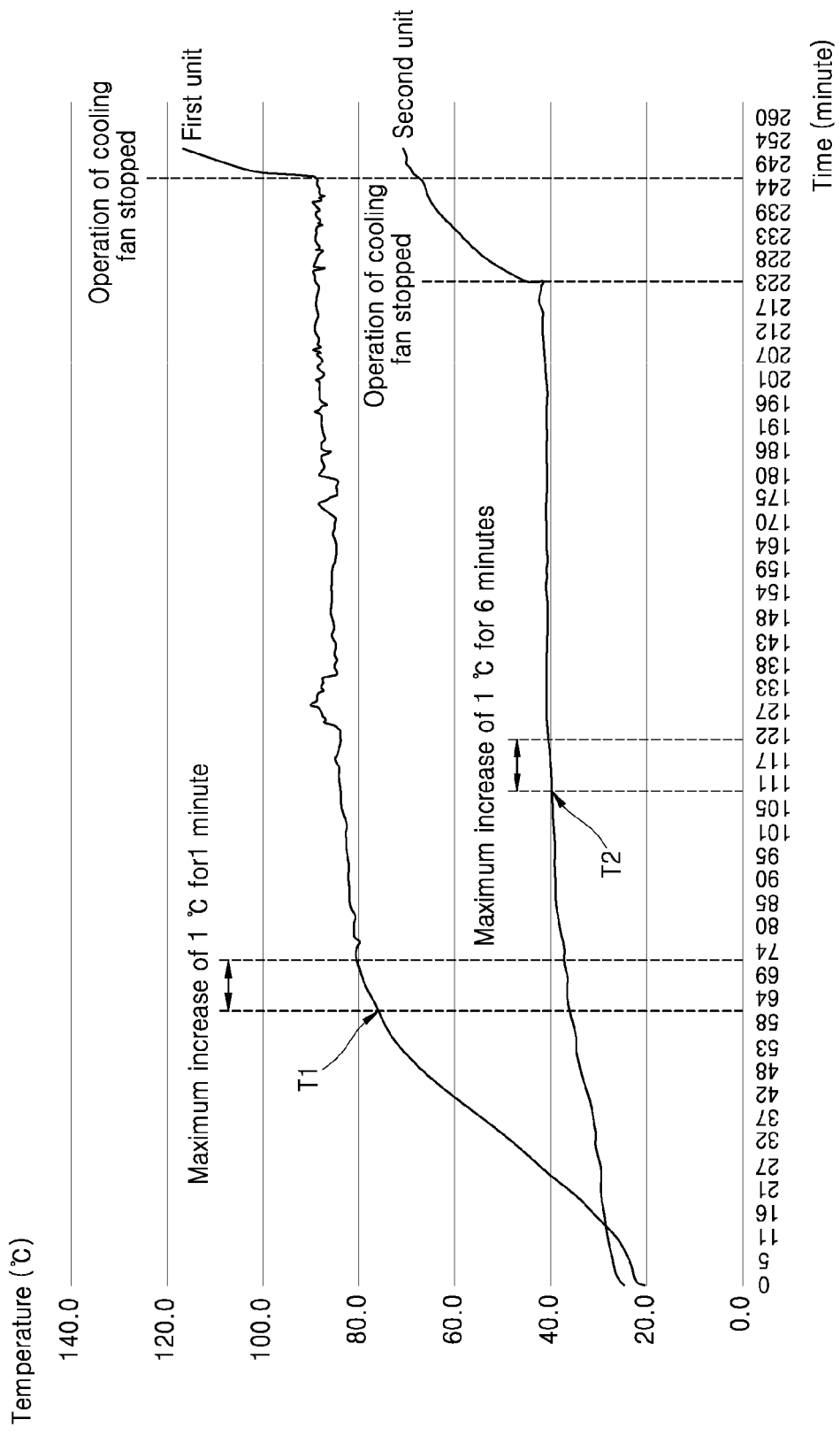
FIG. 13 is a graph showing a tendency in a change in temperatures of an electronic component space of the cooking appliance.

FIG. 10 is a flow chart schematically showing a process of controlling the cooking appliance, and FIG. 11 is a flow chart showing processes of detecting a failure of a cooling fan and controlling an operation of a heating unit in the cooking appliance. FIG. 12 is a flow chart specifically showing a process of detecting a failure of a cooling fan of the cooking appliance, and FIG. 13 is a graph showing a tendency in a change in temperatures of an electronic component space of the cooking appliance.

Logic of detecting a failure of the cooling fan of the cooking appliance is described hereunder with reference to FIGS. 8 to 13.

Referring to FIGS. 8 to 10, when the cooking appliance operates in a first setting mode, the heating unit H operates. Accordingly, the temperature measuring unit 100 may also operate. The first setting mode may involve various cooking operations or a self-cleaning operation of the cooking appliance. Hereunder, the logic of detection a failure of the cooling fan of the cooking appliance is described during the self-cleaning operation of the cooking appliance.

The self-cleaning function of the cooking appliance may involve automatically removing contaminants such as a greasy substance and the like attached (adhering) to a wall of the cooking space. When contaminants such as a greasy substance and the like are attached to a wall of the cooking space, the cooking appliance may perform the self-cleaning function using pyrolysis that is thermal decomposition in which a heat source such as the heating unit H heats the inside of the cooking space to maintain a temperature in the cooking space at a high level for a long period of time and burns out the contaminants.

During the self-cleaning process, the temperature in the cooking space may be maintained at a high level, and accordingly, a temperature of the electronic component space 30 may rise. When the cooling fan 40 makes operational errors during the self-cleaning process, the temperature of the electronic component space 30 may excessively rise, and temperatures of the electronic components in the electronic component space 30 may excessively rise.

During the self-cleaning process, the cooking appliance may monitor the temperature in the electronic component space 30. The temperature monitoring of the cooking appliance may involve monitoring an increase per unit time in temperatures in the cool air passage 50 using the temperature measuring unit 100 and the controller 200 (S10). The above step (hereinafter, a "monitoring step (S10)") may be carried out as follows.

As illustrated in FIGS. 8 to 13, while the self-cleaning function is performed, the temperature measuring unit 100 may measure temperatures in the cool air passage 50 at a first predetermined time interval (S110; hereinafter, a "temperature measuring step"). It would be better that the first predetermined time interval is short. For example, the first predetermined time interval may be set to less than one second.

Information on the temperatures in the cool air passage 50, obtained by the temperature measuring unit 100, may be transmitted to the controller 200 at the first predetermined time interval. The controller 200 having received the information on the temperature in the cool air passage 50, obtained by the temperature measuring unit 100, may compare a current value Tc, i.e., a current temperature value in the cool air passage 50 with a predetermined comparison initiation temperature T1, T2 and may determine whether the current value Tc is the predetermined comparison initiation temperature T1, T2 or greater.

The predetermined comparison initiation temperature T1, T2 may be set to a temperature of the electronic component space 30a, 30b, which is ordinarily measured during the cooking operation or the self-cleaning operation of the cooing appliance. In this case, the predetermined comparison initiation temperature T1, T2 may be set under the assumption that the cooling fan 40 operates normally. That is, the predetermined comparison initiation temperature T1, T2 may be set to an ordinary temperature of the electronic component space when the cooling fan 40 operates normally during the cooking operation or the self-cleaning operation of the cooking appliance.

The predetermined comparison initiation temperature T1, T2 may be set to a temperature that can be ordinarily measured in the cool air passage 50 on condition that the cooling fan 40 operates normally during the self-cleaning operation, for example.

A predetermined comparison initiation temperature T1 during the self-cleaning operation in the first unit 1, and a predetermined comparison initiation temperature T2 during the self-cleaning operation in the second unit 2 may be set to a different value.

When the temperature measuring unit 100 is installed only in the first unit 1, the temperature measuring unit 100 may directly measure a temperature of a corresponding area in an electronic component space 30a (hereinafter, a "first electronic component space") of the first unit 1. Accordingly, there is no big difference between an actual temperature of the first electronic component space 30a and a temperature measured by the temperature measuring unit 100.

However, it is difficult for the temperature measuring unit 100, installed as described above, to directly measure a temperature of an electronic component space 30b (hereinafter, a "second electronic component space") of the second unit 2 in the second electronic component space 30b. Accordingly, the temperature measuring unit 100 has no option but to indirectly measure a temperature of the second electronic component space 30b. For example, the temperature measuring unit 100 may indirectly measure a temperature of the second electronic component pace 30b in a way that measures a temperature of air having passed through the second electronic component space 30b and then introduced into the first electronic component space 30a.

In this case, the temperature of the second electronic component space 30b indirectly measured by the temperature measuring unit 100 is certainly less than an actual temperature of the second electronic component space 30b. While air in the second electronic component space 30b moves to the first electronic component space 30a, heat loss may occur, and accordingly, when the air in the second electronic component space 30b arrives at the cool air passage 50, a temperature of the air becomes less than a temperature of the air in the second electronic component space 30b.

Accordingly, when the predetermined comparison initiation temperature T1 during the self-cleaning operation in the first unit 1, and the predetermined comparison initiation temperature T2 during the self-cleaning operation in the second unit 2 are set to the same value, the controller 200 may make a wrong determination about a state of the second electronic component space 30b.

That is, when a temperature of the second electronic component space 30b, indirectly measured by the temperature measuring unit 100, is less than the predetermined comparison initiation temperature T1 although the temperature of the second electronic component space 30b is the predetermined comparison initiation temperature T1 or greater during the self-cleaning operation in the second unit 2, the controller 200 may find that it does not need to determine whether the cooling fan 40 stops operating yet.

The predetermined comparison initiation temperature T1 (hereinafter, a "first predetermined comparison initiation temperature") during the self-cleaning operation of the first unit 1 may be 70 to 80° C., and the predetermined comparison initiation temperature T2 (hereinafter, a "second predetermined comparison initiation temperature") during the self-cleaning operation of the second unit 2 may be 35 to 45° C., for example. In this case, the predetermined comparison initiation temperature T1 of 70 to 80° C. during the self-cleaning operation of the first unit 1 is determined considering an actual temperature of 70 to 80° C. in the second electronic component space 30b at 35 to 45° C. measured by the temperature measuring unit 100 during the self-cleaning operation of the second unit 2.

However, the figures may not be limited. The first predetermined comparison initiation temperature T1 may be properly set considering a temperature of the first electronic component space 30a, which is ordinarily measured during the self-cleaning operation in the first unit 1, a range of temperatures at which various electronic components in the first electronic component space 30a can operate normally, and the like. Additionally, the second predetermined comparison initiation temperature T2 may be properly set considering a range of temperatures at which various electronic components in the second electronic component space 30b can operate normally, a temperature of the first electronic component space 30a, which is ordinarily measured during the self-cleaning operation in the second unit 2, and the like.

When determining that the current value Tc is equal to or greater than the predetermined comparison initiation temperature in the above process, the controller 200 may compare the current value Tc with a previously value Ta that was measured a second predetermined time before the current value is measured (S13; hereinafter, a "comparing step"). A time span corresponding to the second predetermined time may be set to greater than the first predetermined time interval. For example, when the first predetermined time interval is less than one second, the time span of the second predetermined time may be set to one minute or greater.

The time span of the second predetermined time may be five to seven minutes, preferably, six minutes, for example. A specific time span of the second predetermined time is determined considering the following factors.

The first factor may be a time taken for a change in temperatures of the second electronic component space 30b during the self-cleaning operation in the second unit 2 to affect the temperature measuring unit 100 disposed in the first electronic component space 30a.

During the self-cleaning operation of the second unit 2, a temperature of the second electronic component space 30b indirectly measured by the temperature measuring unit 100 may be less than an actual temperature of the second electronic component space 30b, and there is a difference between a time point when a change in the temperatures in the second electronic component space 30b occurs and a time point when the temperature measuring unit 100 detects the change. Additionally, it takes a certain amount of time for air in the second electronic component space 30b to move to the first electronic component space 30a, and it takes a certain amount of time for the air to raise a temperature of the first electronic component space 30a.

The second factor is a time taken for a temperature of the first electronic component space 30a or the second electronic component space 30b to rise up to a "dangerous" temperature when the cooling fan 40 is out of order, and/or a time for which the electronic components can continue to operate normally or does not fail even though the temperature of the first electronic component space 30a or the second electronic component space 30b has risen up to the dangerous temperature.

For example, when the dangerous temperature seriously affecting performance and durability of the electronic components is 120° C., the second predetermined time needs to be set to less than a time period taken for the temperature of the first electronic component space 30a or the second electronic component space 30b to rise to 120° C.

It is preferable to set the second predetermined time to less than a time period required to suppress an increase in the temperature of the first electronic component space 30a or the second electronic component space 30b before the temperature of the first electronic component space 30a or the second electronic component space 30b rises to 120° C.

Additionally, the second predetermined time needs to be set to less than a time period for which the electronic components can operate normally or does not fail while the temperature of the first electronic component space 30a or the second electronic component space 30b rises to the dangerous temperature.

The two factors described above being taken into account, the second predetermined time may be set to five to seven minutes, preferably, six minutes but not limited. The second predetermined time may be set differently depending on a size and a material of the casing, capacity and performance of the heat source, performance of the cooling fan and the like.

The comparing step (S13) may be repeated at the third predetermined time interval. It is noteworthy that the comparing step (S13) is carried out on condition that a temperature measured in the temperature measuring step (S11) is the predetermined comparison initiation temperature or greater.

That is, when the condition that a temperature measured in the temperature measuring step (S11) is the predetermined comparison initiation temperature or greater is satisfied, the current temperature value Tc may be compared with the previous temperature value Ta that was measured the second predetermined time before the current temperature value Tc is measured.

If the current temperature value Tc is lower than the predetermined comparison initiation temperature while the comparing step (S13) is repeated, the comparing step (S13) proceeding may stop.

The third predetermined time interval may be set to greater than the first predetermined time interval and less than the time span of the second predetermined time. For example, when the first predetermined time interval is less than one second and the time span of the second predetermined time is set to six minutes, the third predetermined time interval may be set to one second or greater and less than six minutes.

The third predetermined time interval is 20 to 40 seconds, preferably, 30 seconds, for example. The figures were determined for allowing the comparing step (S13) to be repeated about two times to four times within one minute or so. Description in relation to this is provided below.

For example, the comparing step (S13) may start after the second predetermined time passes from a time point when a temperature measured in the temperature measuring step (S11) is the predetermined comparison initiation temperature or greater under a desirable condition that both the two measured values compared in the comparing step (S13) are the predetermined comparison initiation temperature or greater.

The temperature of the electronic component space 30a, 30b may increase due to heat generated by the heating unit H while the cooking appliance continues to perform the cooking operation or the self-cleaning operation. Ordinarily, the temperature of the electronic component space 30a, 30b quickly increases until a time point when the temperature of the electronic component space 30a, 30b reaches the predetermined comparison initiation temperature T1, T2 and then increases very smoothly after the time point, and after a certain time point, remains constant.

Given that an ordinary temperature of the electronic component space 30a, 30b during the cooking operation or the self-cleaning operation of the cooking appliance is set to the predetermined comparison initiation temperature, there is no big change in the temperature of the electronic component space 30a,30b after the time point when the temperature of the electronic component space 30a, 30b reaches the predetermined comparison initiation temperature.

When the previous temperature value Ta of the two measured values compared in the comparing step (S13) is the predetermined comparison initiation temperature or less, it is high likely that there is a big difference between the two measured values compared in the comparing step (S13). The difference is likely caused not by a question of whether the cooling fan 40 stops operating but by a difference between a gradient of an increase in temperature at the time point when a current value Tc is measured and a gradient of an increase in temperature at the time point when a previous value Ta is measured.

Considering this, to improve accuracy of determining whether the cooling fan 40 stops operating using the difference between the current value Tc and the previous value Ta, both the two measured values compared in the comparing step (S13) may be the predetermined comparison initiation temperature or greater, for example.

While the monitoring step (S10) including the comparing step (S13) is repeated, the controller 200 may determine whether the cooling fan 40 stops operating based on results monitored in the monitoring step (S10) (S20; hereinafter, a "determining step").

The determining step (S20) may involve determining that the cooling fan 40 stops operating when the difference between the two measured values, i.e., the current value Tc and the previous value Ta, compared in the comparing step (S13) is a predetermined difference Ts or greater (S21).

Specifically, when the difference between the two measured values compared in the comparing step (S13) is the predetermined difference Ts or greater predetermined consecutive times or greater, the controller 200 may determine that the cooling fan 40 stops operating (S23). The predetermined difference Ts may be 3 to 5° C., and the predetermined times may be two to four times, for example.

As described above, when the cooling fan 40 operates normally, it is unlikely that there is a big change in the temperatures of the electronic component space 30a,30b after the time point when the temperature of the electronic component space 30a, 30b reaches the predetermined comparison initiation temperature. That is, in a state in which the cooling fan 40 operates normally, a change in the temperatures of the electronic component space 30a, 30b is ordinarily less than 1° C. for a time period of the second predetermined time.

Accordingly, when the change in the temperatures of the electronic component space 30a, 30b is noticeably greater than 1° C. for the time period of the second predetermined time, the electronic component space 30a, 30b is not considered to have cooled properly. Additionally, the electronic component space 30a, 30b may not properly cool due to a failure of the cooling fan 40.

Considering this, the determining step (S20) may involve determining that the cooling fan 40 stops operating when the difference between the two measured values compared in the comparing step (S13) is equal to or greater than the predetermined difference Ts. Further, the predetermined difference Ts may be set to 3 to 5° C., preferably, 4° C. given that the change in the temperatures of the electronic component space 30a, 30b is ordinarily less than 1° C. for the time period of the second predetermined time, i.e., 6 minutes.

When the predetermined difference Ts is set to less than 3° C., the controller 200 is likely to make a wrong determination due to an error in measurement of the temperature measuring unit 100 together with an instant change in the operation of the heating unit H and the cooling fan 40. When the predetermined difference Ts is set to greater than 5° C., the controller is likely to belatedly determine that the cooling fan 40 stops operating or unlikely to properly determine that the cooling fan 40 stops operating.

Considering this, the predetermined difference Ts may be properly set to a value, corresponding to a lowest temperature, among values that are measured when the cooling fan 40 surely stops operating.

Additionally, when the difference between the two measured values compared in the comparing step (S13) is the predetermined difference Ts or greater (hereinafter, a "high-temperature detection state") predetermined consecutive times, i.e., two to four consecutive times, or greater, it may be determined that the cooling fan 40 stops operating.

Although the predetermined difference Ts is set to a value that is measured when the cooling fan 40 surely stops operating, there are times when the difference between the two measured values compared in the comparing step (S13) is greater than the predetermined difference Ts, due to an error in the measurement of the temperature measuring unit 100.

In this case, when immediately determining whether the cooling fan 40 stops operating, the controller 200 may assume that the cooling fan 40 stops operating and stop the cooking operation or the self-cleaning operation of the cooking appliance even though the cooling fan 40 operates actually. If this happens repeatedly, the cooking operation or the self-cleaning operation of the cooking appliance may not be properly performed, thereby degrading reliability of the cooking appliance.

Considering this, when the high-temperature detection state occurs at least two or more consecutive times, it may be determined that the cooling fan 40 stopped operating.

Without a failure of the temperature measuring unit 100, the high-temperature detection state hardly occurs consecutively and repeatedly due to a temporary error in the measurement of the temperature measuring unit 100. Further, it is impossible that the high-temperature detection state occurs three or more consecutive times due to a temporary error in the measurement of the temperature measuring unit 100. Thus, when the high-temperature detection state occurs three or more consecutive times, it is reasonable to determine that the cooling fan 40 stops operating.

At the predetermined times set to five or more times, more time may be taken to determine whether the cooling fan 40 stops operating without improving accuracy of determining whether the cooling fan 40 stops operating than at the predetermined times set to two to four times. As the time taken to determine whether the cooling fan 40 stops operating increases, the electronic components may be exposed to a high-temperature environment for a longer period of time and more likely to fail.

Considering this, the predetermined times may be set to two to four times, preferably, three times, for example. As a result, the controller 200 may determine whether the cooling fan 40 stops operating accurately and quickly.

When the difference between the current value Tc and the previous value Ta is the predetermined difference Ts or less in the determining step (S20), a count of the predetermined times may be reset, and the logic of detecting a failure of the cooling fan 40 may start again from the beginning.

When the conditions for determining the stop of the operation of the cooling fan 40 are all satisfied in the determining step (S20), the controller 200 may assume that the cooling fan 40 stops operating (S25), and may stop the cooking appliance from operating (S30). When determining that at least any one of the cooling fan 40 of the first unit 1 and the cooling fan 40 of the second unit 2 stops operating in the determining step (S20), the controller 200 may stop the operations of all the units currently operating. Accordingly, all the heating units H operating may stop operating, and the circuit board 31 and the components mounted onto the circuit board 31 may also stop operating.

When the cooking appliance continues to perform the cooking operation in a state where the cooling fan 40 stops operating, temperatures of the electronic components such as the circuit board 31 and the like may excessively increase. If left in this state, the electronic components may fail. Additionally, it is undesirable to keep the cooking appliance performing the cooking operation when the cooling fan 40 is out of order.

When it is determined that the cooling fan 40 is out of order, the cooking appliance may stop the cooking operation. Accordingly, even when the electronic components do not cool properly due to the failure of the cooling fan 40, an excessive increase in the temperatures of the electronic components, or the failure of the electronic components caused by the increase in the temperatures may be prevented.

Further, the failure of the cooling fan 40 may be determined based on the results of the temperature measuring unit 100's measurement of temperatures. Accordingly, the failure of the cooling fan 40 may be quickly determined.

That is, the cooking appliance may quickly determine whether the electronic components cool properly and may stop a cooking operation, when the electronic components do not cool properly due to the failure of the cooling fan 40, thereby preventing the electronic components from overheating and failing.

It is noteworthy that the determination on whether the cooling fan 40 fails is made depending on an increase per unit time in temperature. Determining whether the cooling fan 40 fails depending on an increase per unit time is one thing, and determining whether the cooling fan 40 fails depending on whether a temperature of the electronic component space 30a, 30b reaches a certain temperature is another.

The method of determining whether the cooling fan 40 fails depending on whether a temperature of the electronic component space 30a, 30b reaches a certain temperature may hardly be applied to various types of oven having different sizes of cooking space and heat generating capacity. The temperatures of the electronic component space 30a,30b, which are measured when the cooling fan 40 fails, may differ depending on capacity and heat generating capacity of an oven, the conditions for cooling of the electronic component space 30a, 30b, and the like.

To apply the method of determining whether the cooling fan 40 fails depending on whether a temperature of the electronic component space 30a, 30b reaches a certain temperature, a temperature (hereinafter, a "highest set temperature") as a reference for determining whether the cooling fan 40 fails needs to be set differently for each sort of ovens.

That is, in the method of determining whether the cooling fan 40 fails depending on whether a temperature of the electronic component space 30a, 30b reaches a highest set temperature, the highest set temperature needs to be set to a different value for each sort of ovens, causing inconvenience.

Additionally, in the method of determining whether the cooling fan 40 fails depending on whether a temperature of the electronic component space 30a, 30b reaches a highest set temperature, when the first unit 1 is stacked on top of the second unit 2 as shown, it is difficult to find a failure of the cooling fan 40 installed in the second unit 2.

A temperature of the electronic component space 30a, 30b of the second unit 2, measured by the temperature measuring unit 100 in the first unit 1, may be less than an actual temperature of the electronic component space 30a, 30b of the second unit 2.

When the highest set temperature is set with respect to a temperature of the electronic component space 30a, 30b of the first unit 1, a temperature that is measured by the temperature measuring unit 100 when the cooling fan 40 of the second unit 2 fails may rarely reach the highest set temperature. Thus, even when the cooling fan 40 of the second unit 2 fails, it is difficult to find a failure of the cooling fan 40.

Considering this, a highest set temperature during an operation of the first unit 1, and a highest set temperature during an operation of the second unit 2 may be set differently. However, it is difficult to find a failure of the cooling fan 40 of the second unit 2 in this way when the first unit 1 and the second 2 operate at the same time.

Determination on whether the cooling fan 40 fails or not may be made depending on an increase per unit time in temperature. That is, the coking appliance may check whether a temperature difference between two temperature values, which are measured at different time points having the time difference of the second predetermined time, is the predetermined difference Ts or greater to determine whether the cooling fan 40 fails.

Regardless of different sizes of a cooking space and heat generating capacity, ovens have a temperature increase rate within a similar range. Naturally, most ovens having different sizes of cooking space and heat generating capacity have similar tendency in a change in temperatures of the electronic component space 30a, 30b after the time point when the temperature of the electronic component space 30a, 30b reaches the predetermined comparison initiation temperature.

Considering this, the cooking appliance may determine whether the cooling fan 40 fails depending on an increase per unit time in temperature, thereby making it possible to apply a control operation to stop the cooking appliance from operating at a time of failure of the cooling fan 40 to various types of ovens having different capacity and hear generation quantity on the same basis.

Additionally, the cooking appliance may effectively find out a failure of the cooling fan 40 installed in the second unit 2 in the lower portion of the cooking appliance in which the first unit 1 is stacked on top of the second unit 2.

As long as a current temperature is the predetermined comparison initiation temperature or greater, a failure of the cooling fan 40 may be found based on an increase per unit time in temperature regardless of the current temperature.

For example, even if the temperature measured by the temperature measuring unit 100 when the cooling fan 40 fails during an operation of the second unit 2 is less than the temperature measured by the temperature measuring unit 100 when the cooling fan 40 operates normally during an operation of the first unit 1, as long as an increase per unit time in temperature is the predetermined difference Ts or greater, the cooking appliance may determine that the cooling fan 40 stops operating and may stop its operation.

In conclusion, in the method for controlling a cooking appliance according to the invention, the control operation to stop the cooking appliance from operating at a time of failure of the cooking appliance 40 may be applied to various types of ovens having different sizes of cooking spaces and heat generating capacity in the same or similar way, and a failure of the cooling fan 40 may be effectively detected in all the units of the cooking appliance, in which the first unit 1 is stacked on top of the second unit 2.

The embodiments are described above with reference to a number of illustrative embodiments thereof. However, the embodiments are provided only as examples, and numerous other modifications and embodiments can be devised by one skilled in the art, based on the above embodiments. Thus, the protection scope of the subject matter should be defined by the appended claims.

DESCRIPTION OF REFERENCE NUMERAL

10: Main body
11: Cavity
11*a*: First area
11*b*: Second area
11*c*: Side
11*d*: Rear surface
13: Front panel
14: Inlet
15: Cooking space
16: Door
17: Handle
18: Convection unit
20: Control panel
21: Knob
22: Display
25: Electronic component space cover
30: Electronic component space
31: Circuit board
33: Board case
34: Coupling projection
35: Supporter
36: Support plate
37: Air guide
37*a*: Lower end coupling surface
37*b*: Upper end coupling surface
38: Rear plate
39: Outlet
40: Cooling fan
50: Cool air passage
100: Temperature measuring unit
200: Controller

What is claimed is:

1. A cooking appliance comprising:
   a body;
   a cavity formed inside the body, the cavity provided with a cooking space therein;
   a heating unit configured to heat the cooking space;
   an electronic component space provided at a portion of the body located outside the cavity, wherein the electronic component space comprises:
   a circuit board disposed inside the electronic component space;
   a supporter to space the circuit board apart from the cavity and support the circuit board;
   a cooling fan configured to generate a flow of air passing through a cool air passage;
   a temperature measuring unit provided at the supporter, the temperature measuring unit being supported by the supporter and configured to measure a temperature inside the cool air passage and transmit temperature data comprising the measured temperature inside the cool air passage; and
   a controller to receive the temperature data from the temperature measuring unit, whereby the controller is configured to monitor an increase per unit time in the temperature measured by the temperature measuring unit and control an operation of the heating unit based on the monitored result,
   wherein the supporter comprises an air guide disposed at a lateral portion of the circuit board, protruding from the cavity in an upward direction, and blocking a lateral portion of the cool air passage, and the temperature measuring unit is provided at the air guide.

2. The cooking appliance of claim 1, wherein the cool air passage is a space surrounded by the cavity, the circuit board and the supporter.

3. The cooking appliance of claim 1, wherein the temperature measuring unit is configured to measure a temperature of the circuit board.

4. The cooking appliance of claim 1, wherein the controller stops the heating unit from operating when the increase per unit time in temperatures measured by the temperature measuring unit exceeds a predetermined value.

5. The cooking appliance of claim 4, wherein the temperature measuring unit measures a temperature in the cool air passage at a first predetermined time interval, and
   the controller compares the currently measured temperature in the cool air passage with a value that is measured a second predetermined time before the current temperature is measured, the second predetermined time being greater than the first predetermined time,
   wherein the controller stops the heating unit from operating when a difference between the value that is measured the first predetermined time and the value that is measured second predetermined time is a predetermined difference Ts or greater.

6. The method of claim 5, wherein the cooking appliance comprises a first unit and a second unit respectively comprising the cavity, the heating unit and the cooling fan,
   wherein the second unit is disposed below the first unit,
   wherein the temperature measuring unit is disposed inside the first unit, and
   wherein the controller stops the heating unit from operating when any one of the cooling fan of the first unit and the cooling fan of the second unit stops operating.

7. The cooking appliance of claim 1, wherein the temperature measuring unit is disposed between the cavity and the circuit board.

8. The cooking appliance of claim 1, wherein
a door is disposed at a front side of the cavity,
the cooling fan is disposed at a rear side of the body, and
the temperature measuring unit is disposed between the door and the cooling fan.

9. The cooking appliance of claim 8, wherein the temperature measuring unit is disposed closer to the door than to the cooling fan.

10. A method for controlling an operation of a cooking appliance, the cooking apparatus comprising:
a body;
a cavity formed inside the body, the cavity provided with a cooking space therein;
a heating unit configured to heat the cooking space;
an electronic component space provided at a portion of the body located outside the cavity, wherein the electronic component space comprises:
a circuit board disposed inside the electronic component space;
a supporter to space the circuit board apart from the cavity and support the circuit board;
a cooling fan configured to generate a flow of air passing through a cool air passage;
a temperature measuring unit provided at the supporter, the temperature measuring unit being supported by the supporter and configured to measure a temperature inside the cool air passage and transmit temperature data comprising the measured temperature inside the cool air passage; and
a controller to receive the temperature data from the temperature measuring unit, whereby the controller is configured to monitor an increase per unit time in the temperature measured by the temperature measuring unit and control an operation of the heating unit based on the monitored result;
wherein the method for controlling the operation of the cooking appliance comprises:
a monitoring step of monitoring, via the controller, an increase per unit time in temperatures in the cool air passage;
a determining step of determining, via the controller, whether to stop the cooling fan from operating based on results monitored in the monitoring step; and
an operation controlling step of stopping the heating unit from operating when it is confirmed by the controller that the cooling fan is not operating,
the monitoring step, comprising:
a temperature measuring step, via the temperature measure unit, of measuring a temperature in the cool air passage at a first predetermined time interval; and
a comparing step, via the controller, of comparing a current value that is currently measured in the temperature measuring step with a previous value that is measured a second predetermined time before the current value is measured in the temperature measuring step wherein the second predetermined time is greater than the first predetermined time,
wherein the cooking appliance comprises a first unit disposed in an upper portion of the cooking appliance, and a second unit disposed in a lower portion of the first unit,
the first unit and the second unit respectively comprise the cavity, the heating unit and the cooling fan, and
the temperature measuring unit is disposed in the first unit,
wherein the operation controlling step comprises stopping the heating unit from operating when it is confirmed, via the controller, that at least any one of the cooling fan of the first unit and the cooling fan of the second unit has stopped operating,
wherein when the first unit operates, the comparing step starts at a time point when a temperature measured in the temperature measuring step is equal to or greater than a first predetermined comparison initiation temperature (T1), and
when the second unit operates, the comparing step starts at a time point when a temperature measured in the temperature measuring step is equal to or greater than a second predetermined comparison initiation temperature (T2),
wherein the second predetermined comparison initiation temperature (T2) is less than the first predetermined comparison initiation temperature (T1).

11. The method of claim 10, wherein the determining step comprises confirming, via the controller, that a difference between the two measured values compared in the comparing step is a predetermined difference (Ts) or greater and then stopping the cooling fan from operating.

12. The method of claim 11, wherein the comparing step is repeated at intervals of a third predetermined time that is less than the second predetermined time,
the determining step comprises confirming, via the controller, that that the difference between the two measured values compared in the comparing step is the predetermined difference (Ts) or greater predetermined amount of consecutive times and then stopping the cooling fan from operating.

13. A method for controlling an operation of a cooking appliance, the cooking appliance comprising:
a body;
a cavity formed inside the body, the cavity provided with a cooking space therein;
a heating unit configured to heat the cooking space;
an electronic component space provided at a portion of the body located outside the cavity, wherein the electronic component space comprises:
a circuit board disposed inside the electronic component space;
a supporter to space the circuit board apart from the cavity and support the circuit board;
a cooling fan configured to generate a flow of air passing through a cool air passage;
a temperature measuring unit provided at the supporter, the temperature measuring unit being supported by the supporter and configured to measure a temperature inside the cool air passage and transmit temperature data comprising the measured temperature inside the cool air passage; and
a controller to receive the temperature data from the temperature measuring unit, whereby the controller is configured to monitor an increase per unit time in the temperature measured by the temperature measuring unit and control an operation of the heating unit based on the monitored result;
wherein the method for controlling the operation of the cooking appliance comprises:
a monitoring step of monitoring, via the controller, an increase per unit time in temperatures in the cool air passage;
a determining step of determining, via the controller, whether to stop the cooling fan from operating based on results monitored in the monitoring step; and an operation controlling step of stopping the heating unit from operating when it is confirmed by the controller that the cooling fan is not operating, the monitoring step, comprising:
- a temperature measuring step, via the temperature measure unit, of measuring a temperature in the cool air passage at a first predetermined time interval; and
- a comparing step, via the controller, of comparing a current value that is currently measured in the temperature measuring step with a previous value that is measured a second predetermined time before the current value is measured in the temperature measuring step wherein the second predetermined time is greater than the first predetermined time, wherein the determining step comprises confirming, via the controller, that a difference between the two measured values compared in the comparing step is a predetermined difference (Ts) or greater and then stopping the cooling fan from operating, wherein the comparing step is repeated at intervals of a third predetermined time that is less than the second predetermined time, the determining step comprises confirming, via the controller, that that the difference between the two measured values compared in the comparing step is the predetermined difference (Ts) or greater predetermined consecutive times and then stopping the cooling fan from operating, wherein the predetermined difference Ts is 3 to 5° C., the second predetermined time is five to seven minutes, the third predetermined time is 20 to 40 seconds, and the predetermined amount of times are two to four times.

14. The method of claim 10, wherein the comparing step starts after a time point when a temperature measured in the temperature measuring step is equal to or greater than a predetermined comparison initiation temperature (T1, T2).

15. The method of claim 14, wherein the comparing step starts after the second predetermined time passes from the time point when a temperature measured in the temperature measuring step is equal to or greater than a predetermined comparison initiation temperature (T1, T2).

16. The method of claim 15, wherein measured values compared in the comparing step are temperatures that are equal to or greater than the predetermined comparison initiation temperature (T1, T2).

* * * * *